United States Patent
Chang et al.

(10) Patent No.: US 12,417,945 B2
(45) Date of Patent: Sep. 16, 2025

(54) CONTACT FEATURES OF SEMICONDUCTOR DEVICE AND METHOD OF FORMING SAME

(71) Applicant: Taiwan Semiconductor Manufacturing Co., Ltd., Hsinchu (TW)

(72) Inventors: Pei Shan Chang, Taipei (TW); Yi-Hsiang Chao, New Taipei (TW); Chun-Hsien Huang, Hsinchu (TW); Peng-Hao Hsu, Hsinchu (TW); Kevin Lee, Hsinchu (TW); Shu-Lan Chang, Hsinchu (TW); Ya-Yi Cheng, Taichung (TW); Ching-Yi Chen, Hsinchu (TW); Wei-Jung Lin, Hsinchu (TW); Chih-Wei Chang, Hsinchu (TW); Ming-Hsing Tsai, Chu-Pei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 553 days.

(21) Appl. No.: 17/663,315

(22) Filed: May 13, 2022

(65) Prior Publication Data

US 2023/0260836 A1 Aug. 17, 2023

Related U.S. Application Data

(60) Provisional application No. 63/267,948, filed on Feb. 14, 2022.

(51) Int. Cl.
*H01L 21/768* (2006.01)
*H10D 30/01* (2025.01)
(Continued)

(52) U.S. Cl.
CPC .. *H01L 21/76852* (2013.01); *H01L 21/76865* (2013.01); *H01L 21/76876* (2013.01);
(Continued)

(58) Field of Classification Search
CPC ......... H01L 21/76852; H01L 21/76865; H01L 21/76876; H01L 21/76879;
(Continued)

(56) References Cited

U.S. PATENT DOCUMENTS 9,105,490 B2   8/2015  Wang et al.
9,236,267 B2   1/2016  De et al.
(Continued)

*Primary Examiner* — Michelle Mandala
(74) *Attorney, Agent, or Firm* — Slater Matsil, LLP

(57) ABSTRACT

A method includes forming a dielectric layer over a source/drain region. An opening is formed in the dielectric layer. The opening exposes a portion of the source/drain region. A conductive liner is formed on sidewalls and a bottom of the opening. A surface modification process is performed on an exposed surface of the conductive liner. The surface modification process forms a surface coating layer over the conductive liner. The surface coating layer is removed to expose the conductive liner. The conductive liner is removed from the sidewalls of the opening. The opening is filled with a conductive material in a bottom-up manner. The conductive material is in physical contact with a remaining portion of the conductive liner and the dielectric layer.

20 Claims, 36 Drawing Sheets

(51) Int. Cl.
*H10D 30/67* (2025.01)
*H10D 62/10* (2025.01)
*H10D 84/01* (2025.01)
*H10D 84/03* (2025.01)
*H01L 21/285* (2006.01)

(52) U.S. Cl.
CPC ..... *H01L 21/76879* (2013.01); *H10D 30/031* (2025.01); *H10D 30/6713* (2025.01); *H10D 30/6757* (2025.01); *H10D 62/118* (2025.01); *H10D 84/013* (2025.01); *H10D 84/038* (2025.01); *H01L 21/28518* (2013.01)

(58) Field of Classification Search
CPC ............ H01L 21/28518; H10D 30/031; H10D 30/6713; H10D 30/6757; H10D 62/118; H10D 84/013; H10D 84/038
See application file for complete search history.

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Warg et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,647,071 B2 | 5/2017 | Peng et al. | |
| 9,831,183 B2 | 11/2017 | Lin et al. | |
| 9,859,386 B2 | 1/2018 | Ho et al. | |
| 10,361,120 B2 * | 7/2019 | Wang | H01L 23/53238 |
| 11,776,900 B2 * | 10/2023 | Cheng | H01L 21/76841 |
| | | | 257/751 |
| 12,125,876 B2 * | 10/2024 | Wang | H10D 84/834 |
| 2019/0378722 A1 * | 12/2019 | Economikos | H10D 30/62 |
| 2020/0119938 A1 * | 4/2020 | Rassam | H04L 41/0273 |
| 2020/0294809 A1 * | 9/2020 | Chen | H01L 21/823821 |
| 2021/0005727 A1 * | 1/2021 | Lin | H10D 30/6219 |
| 2021/0035861 A1 * | 2/2021 | Chen | H10D 84/0186 |
| 2021/0050253 A1 * | 2/2021 | Chiou | H01L 21/76895 |
| 2021/0407900 A1 * | 12/2021 | Yu | H01L 21/76898 |
| 2022/0052168 A1 * | 2/2022 | Chang | H10D 64/258 |
| 2022/0119938 A1 * | 4/2022 | Zeeshan | C23C 16/45525 |
| 2022/0359758 A1 * | 11/2022 | Madisetti | H10D 30/6755 |
| 2023/0090755 A1 * | 3/2023 | Park | H01L 21/76831 |
| | | | 257/751 |
| 2023/0187530 A1 * | 6/2023 | Huang | H01L 29/4966 |
| | | | 257/288 |
| 2024/0047269 A1 * | 2/2024 | Na | H01L 21/76843 |

\* cited by examiner

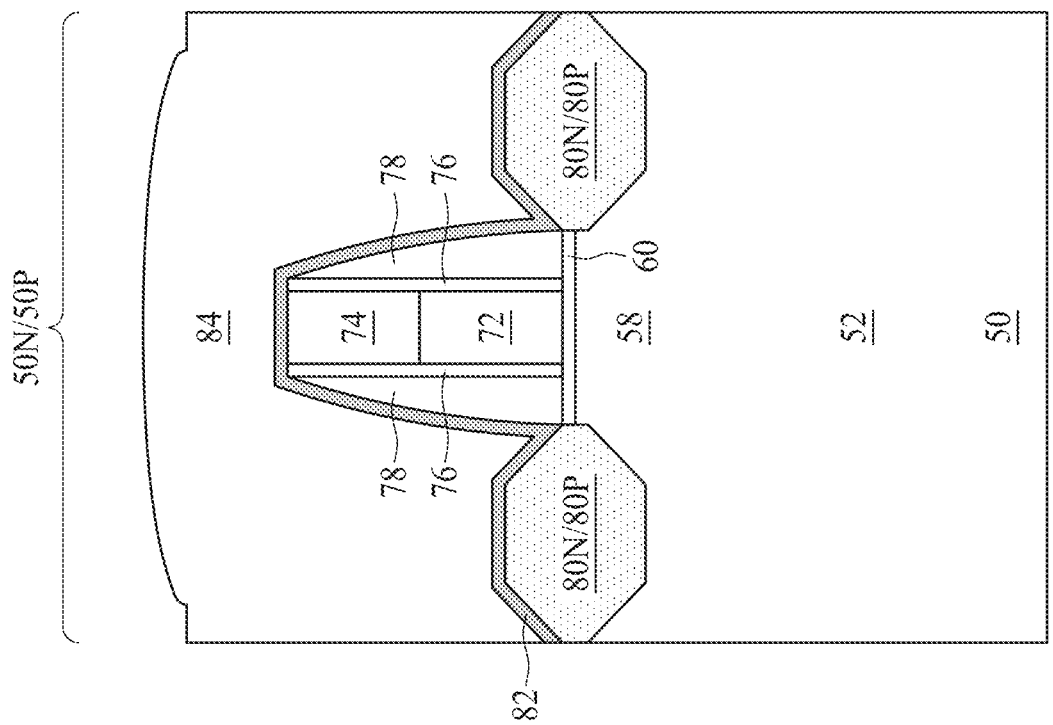
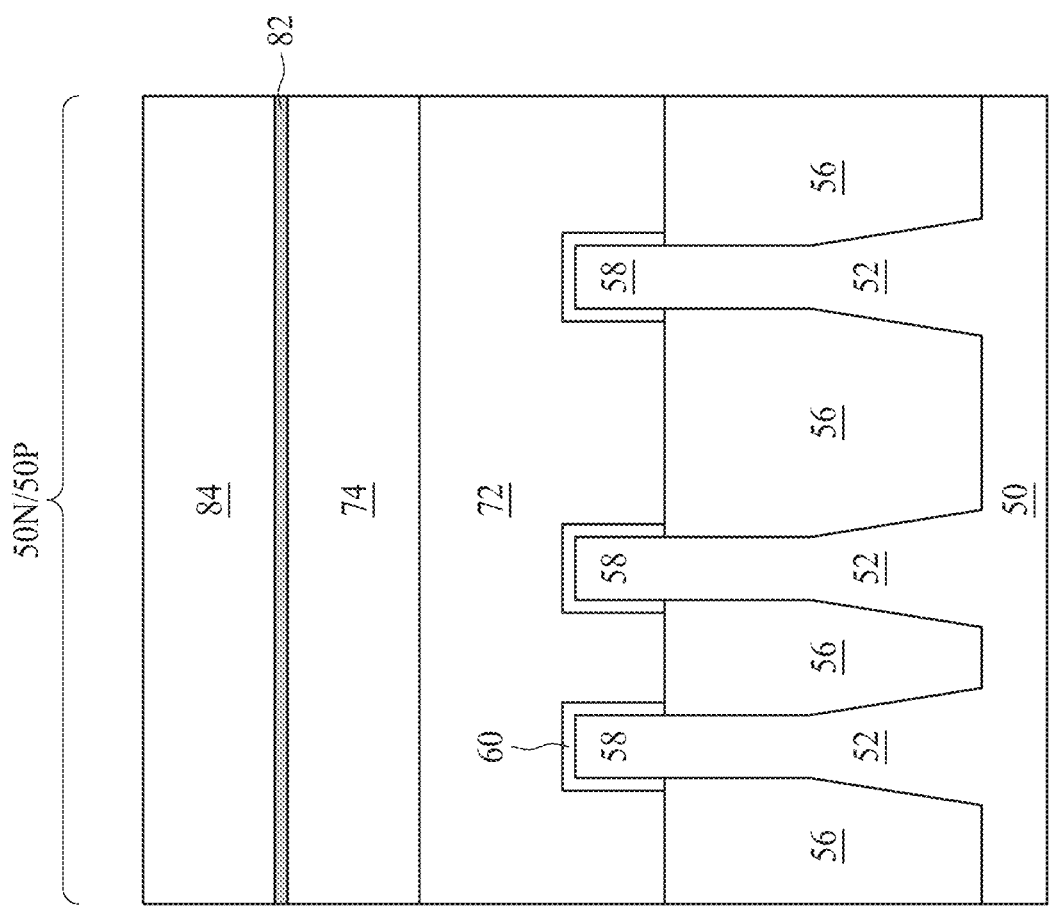
Figure 11A
Figure 11B

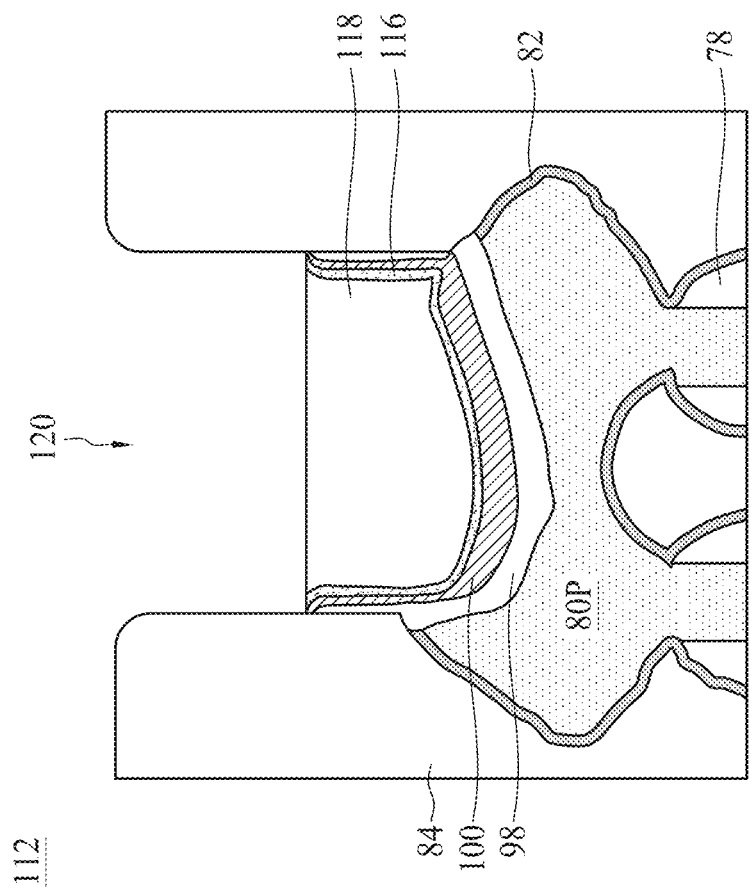
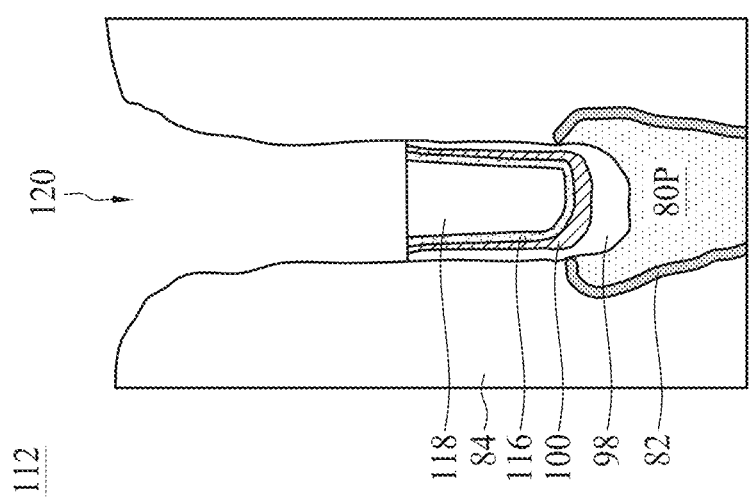
Figure 21B
Figure 21A

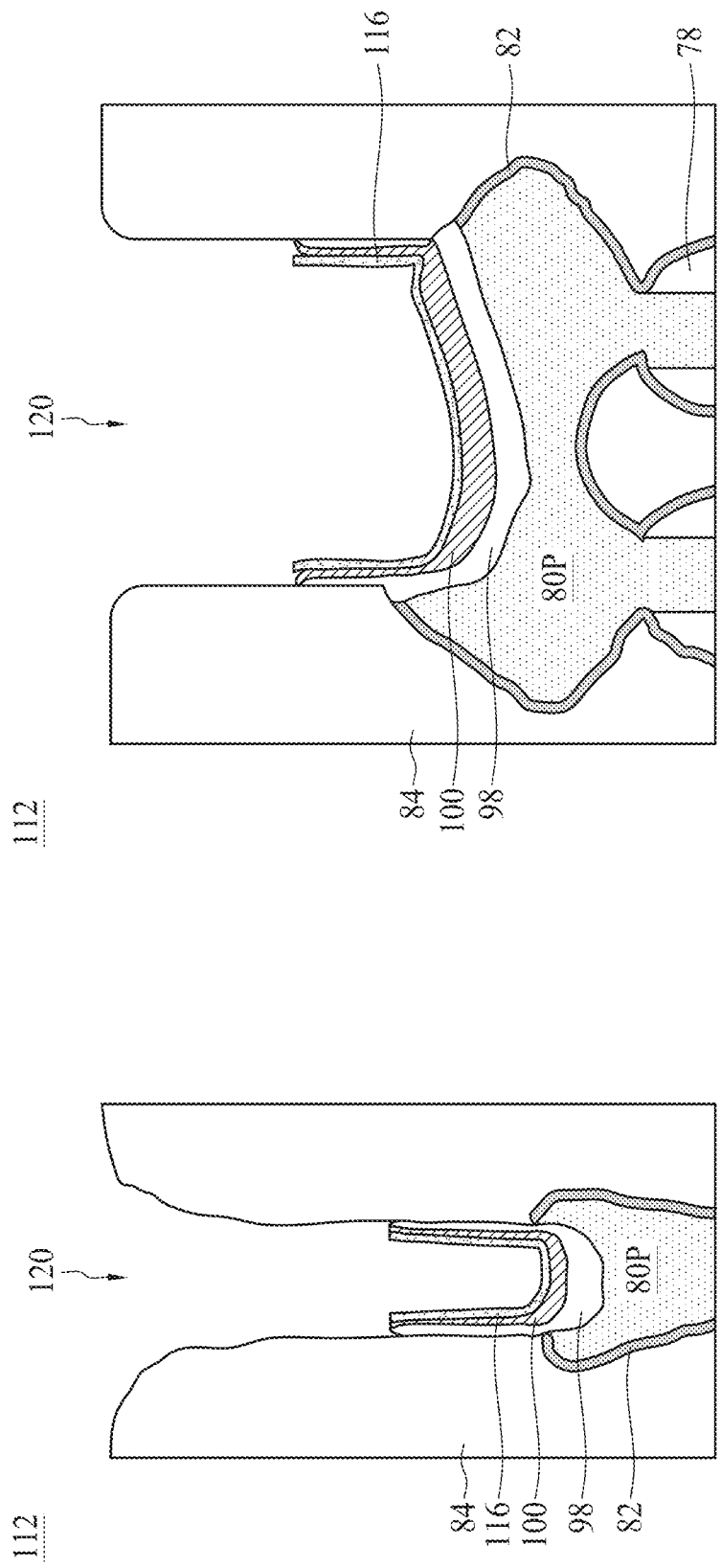

CONTACT FEATURES OF SEMICONDUCTOR DEVICE AND METHOD OF FORMING SAME

PRIORITY CLAIM AND CROSS-REFERENCE

This application claims the benefit of U.S. Provisional Application No. 63/267,948, filed on Feb. 14, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 11A, 11B, 11C, 12A, 12B, 13A, 13B, 14A, 14B, 14C, 15A, 15B, 15C, 15D, 16A, 16B, and 16C are three-dimensional and cross-sectional views of intermediate stages in the manufacturing of a FinFET device, in accordance with some embodiments.

FIGS. 17A, 17B, 18A, 18B, 19A, 19B, 20A, 20B, 21A, 21B, 22A, 22B, 23A, 23B, 24A, 24B, 25A, and 25B are cross-sectional views of intermediate stages in the manufacturing of a contact feature, in accordance with some embodiments.

DETAILED DESCRIPTION

Figure 1:
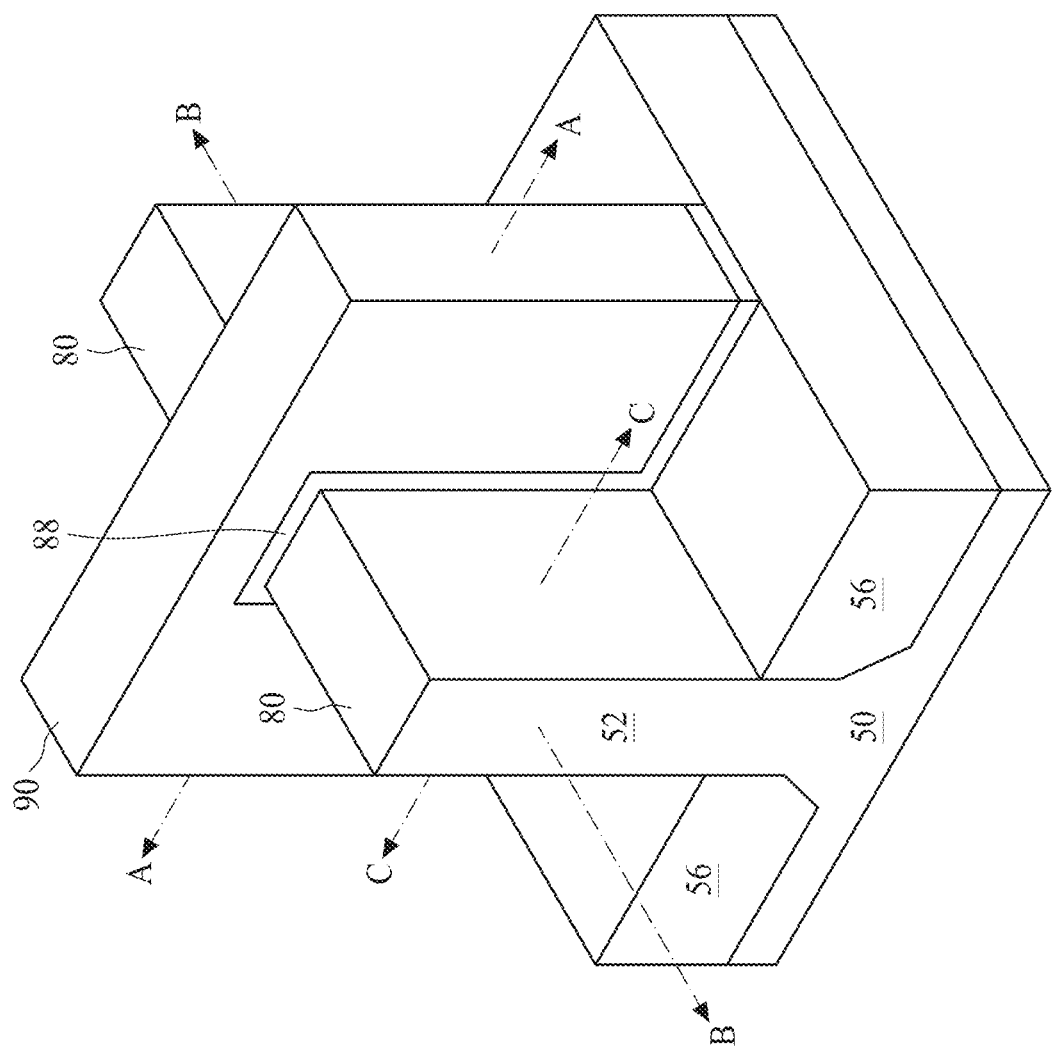
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, contact features (such as, for example, source/drain contact plugs, gate contact plugs, source/drain and gate vias, or the like) of a semiconductor device and methods of forming the same. Various embodiments presented herein are discussed in the context of a fin field-effect transistor (FinFET) device formed using a gate-last process. In other embodiments, a gate-first process may be used. Various embodiments may be applied, however, to dies comprising other types of transistors, such as planar transistors or gate-all-around (GAA) transistors (for example, nanostructure (e.g., nanosheet, nanowire, or the like) field-effect transistors (NSFETs)) in lieu of or in combination with the FinFETs. In some embodiments, during formation of contact features, a conductive liner (such as a seed/barrier layer) is formed in a contact opening and a surface treatment is performed on the conductive liner to enhance compatibility between the conductive liner and subsequently formed bottom anti-reflective coating (BARC) layer. In some embodiments, the surface treatment modifies a surface portion of the conductive liner or deposits a desired material on a surface of the conductive liner to form a surface coating layer over the conductive liner. The surface coating layer may promote a cross-linking reaction of the BARC layer and improve filling of the contact opening with the BARC layer, so that damage to underlying layers (such as the conductive liner, a silicide region, portions of an epitaxial source/drain region, gate layers, or the like) during a top pull-back process for removing top portions of the conductive liner is reduced or avoided. By avoiding the damage to the conductive liner, the conductive liner may maintain a uniform thickness or may have reduced thickness variation, which may assist with the bottom-up filling of contact openings with a conductive fill material to form contact features. Various embodiments discussed herein allow for improving contact feature filling, reducing a resistance of the contact features, improving reliability of the contact features, and improving device yield.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed on the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 88 is along sidewalls and over a top surface of the fin 52, and a gate electrode 90 is over the gate dielectric layer 88. Source/drain regions 80 are disposed in opposite sides of the fin 52 with respect to the gate dielectric layer 88 and gate electrode 90. FIG. 1 further illustrates reference cross-sections that are used in later figures. Cross-section A-A is along a longitudinal axis of the gate electrode 90 and in a direction, for example, perpendicular to the direction of current flow between the source/drain regions 80 of the FinFET. Cross-section B-B is perpendicular to cross-section A-A and is along a longitudinal axis of the fin 52 and in a direction of, for example, a current flow between the source/drain regions 80 of the FinFET. Cross-section C-C is parallel to cross-section A-A and extends through a source/drain region 80 of the FinFET. Subsequent figures refer to these reference cross-sections for clarity.

FIGS. 2, 3, 4, 5, 6, 7, 8A, 8B, 9A, 9B, 10A, 10B, 10C, 11A, 11B, 11C, 12A, 12B, 13A, 13B, 14A, 14B, 14C, 15A, 15B, 15C, 15D, 16A, 16B, and 16C are three-dimensional and cross-sectional views of intermediate stages in the manufacturing of a FinFET device, in accordance with some embodiments. FIGS. 2-7 and 8A-16A are illustrated along the reference cross-section A-A illustrated in FIG. 1, except for multiple fins/FinFETs. FIGS. 8B-16B and 14C are illustrated along the reference cross-section B-B illustrated in FIG. 1, except for multiple fins/FinFETs. FIGS. 10C, 11C, 15C, and 16C are illustrated along reference cross-section C-C illustrated in FIG. 1, except for multiple fins/FinFETs. FIG. 15D illustrates a three-dimensional view.

Figure 2:
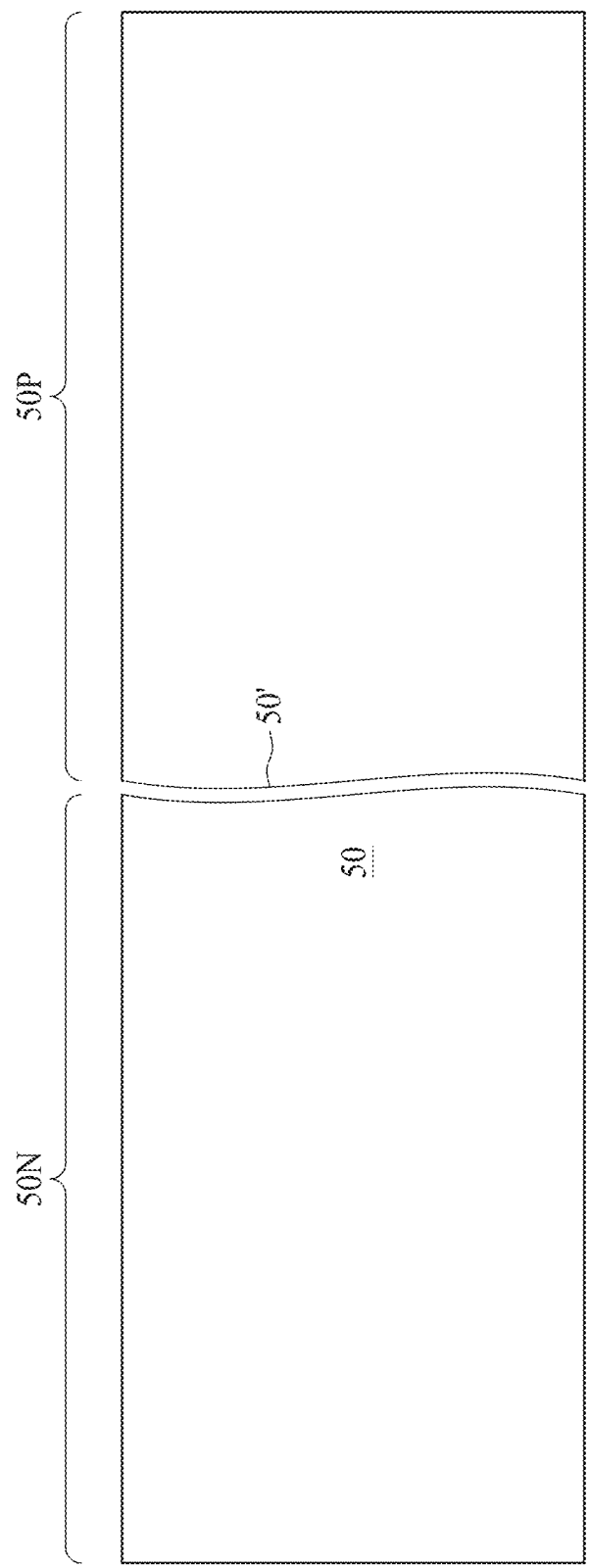

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In some embodiments, the substrate 50 may have an n-type region 50N and a p-type region 50P. The n-type region 50N is for forming n-type devices, such as NMOS transistors, e.g., n-type FinFETs. The p-type region 50P is for forming p-type devices, such as PMOS transistors, e.g., p-type FinFETs. The n-type region 50N may be physically separated from the p-type region 50P (as illustrated by a divider 50'), and any number of device features (e.g., other active devices, doped regions, isolation structures, etc.) may be disposed between the n-type region 50N and the p-type region 50P.

Figure 3:
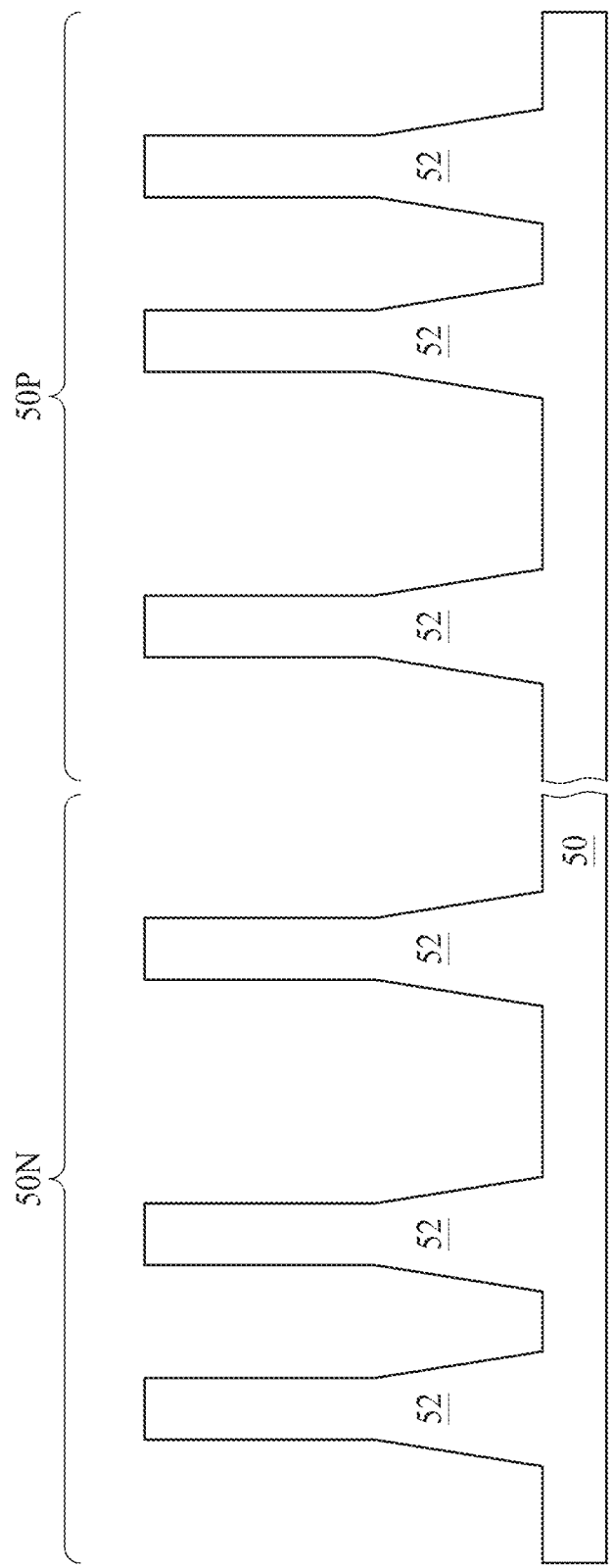

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The above method for forming the fins 52 is merely an example method for forming the fins 52. The fins 52 may be formed by any suitable method. For example, the fins 52 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as an etch mask to form the fins 52. In some embodiments, a mask (or other layer) may remain on the fins 52.

Figure 4:
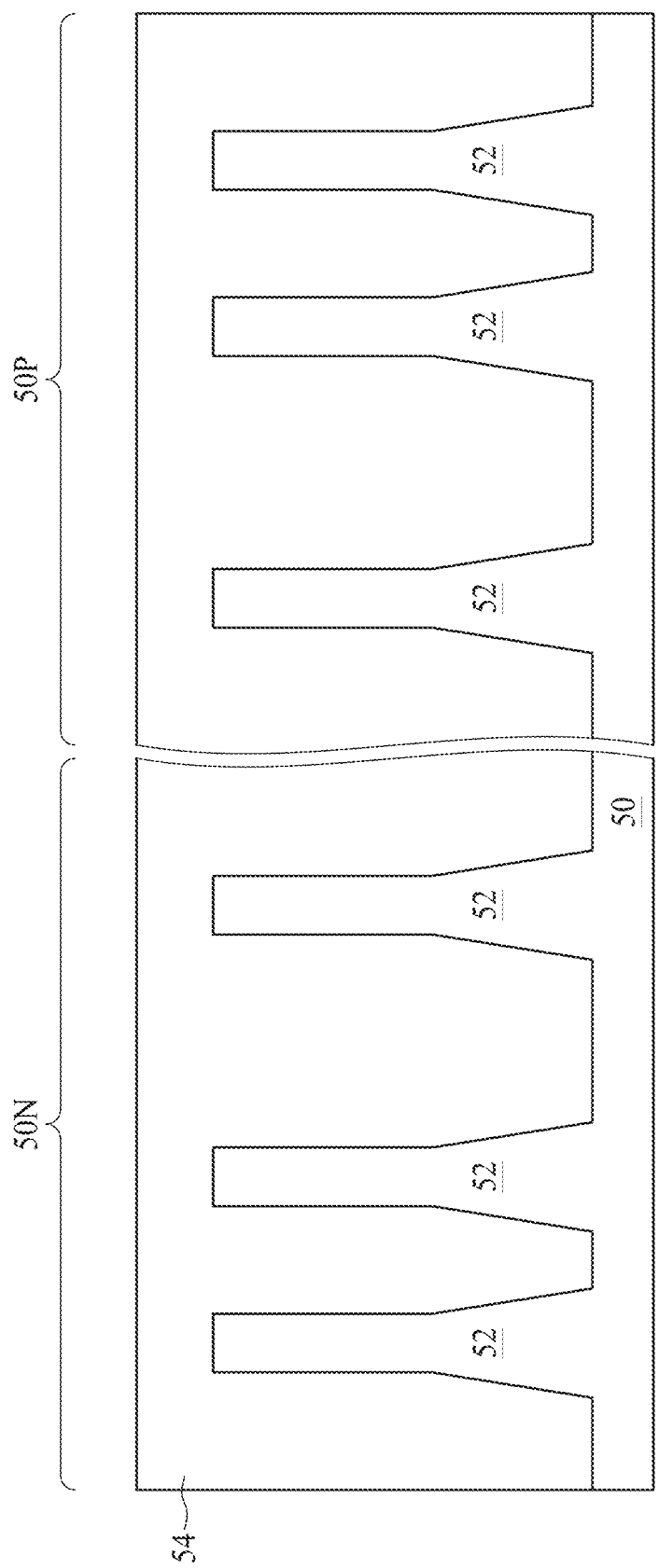

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material 54 is formed. In an embodiment, the insulation material 54 is formed such that excess insulation material 54 covers the fins 52. Although the insulation material 54 is illustrated as a single layer, some embodiments may utilize multiple layers. For example, in some embodiments, a liner (not shown) may first be formed along surfaces of the substrate 50 and the fins 52. Thereafter, a fill material, such as those discussed above may be formed over the liner.

Figure 5:
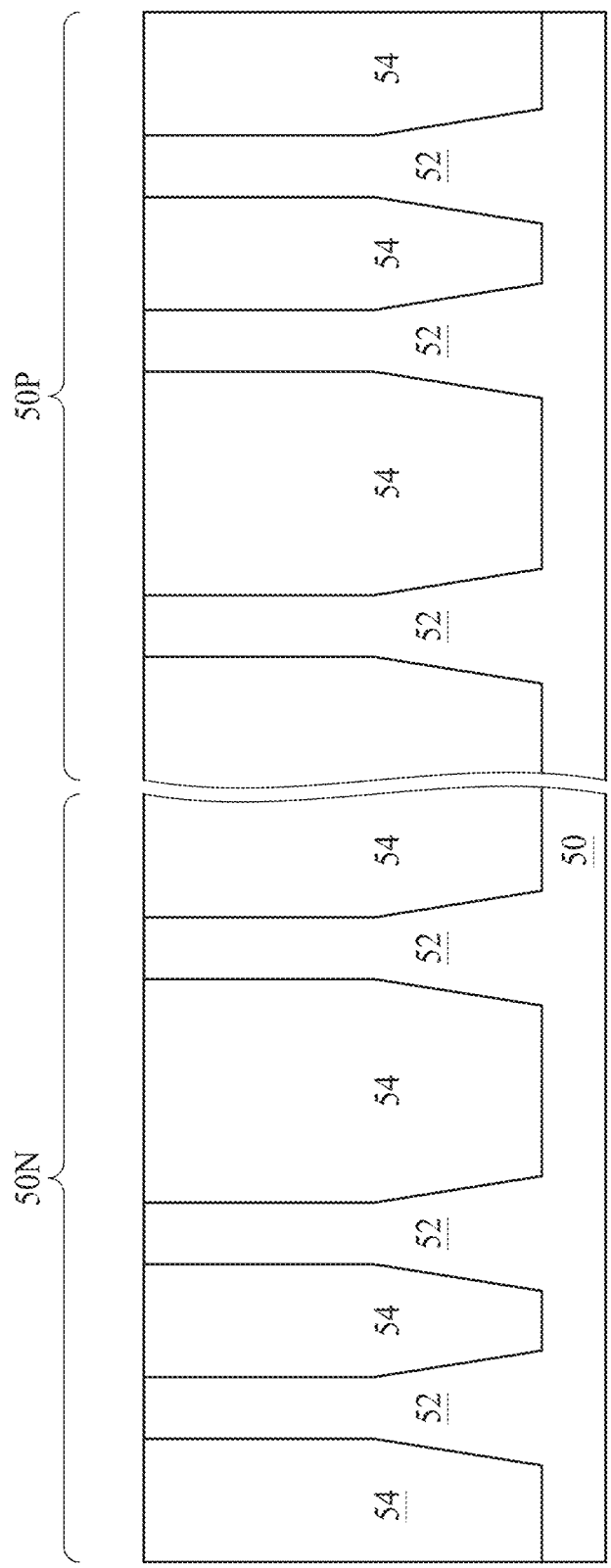

In FIG. 5, a removal process is applied to the insulation material 54 to remove excess insulation material 54 over the fins 52. In some embodiments, a planarization process, such as a chemical mechanical polish (CMP), an etch-back process, combinations thereof, or the like may be utilized. The planarization process exposes the fins 52 such that top surfaces of the fins 52 and the insulation material 54 are substantially level or coplanar (within process variations of the planarization process) after the planarization process is completed. In embodiments in which a mask remains on the fins 52, the planarization process may expose the mask or remove the mask such that top surfaces of the mask or the fins 52, respectively, and the insulation material 54 are substantially level or coplanar (within process variations of the planarization process) after the planarization process is completed.

Figure 6:
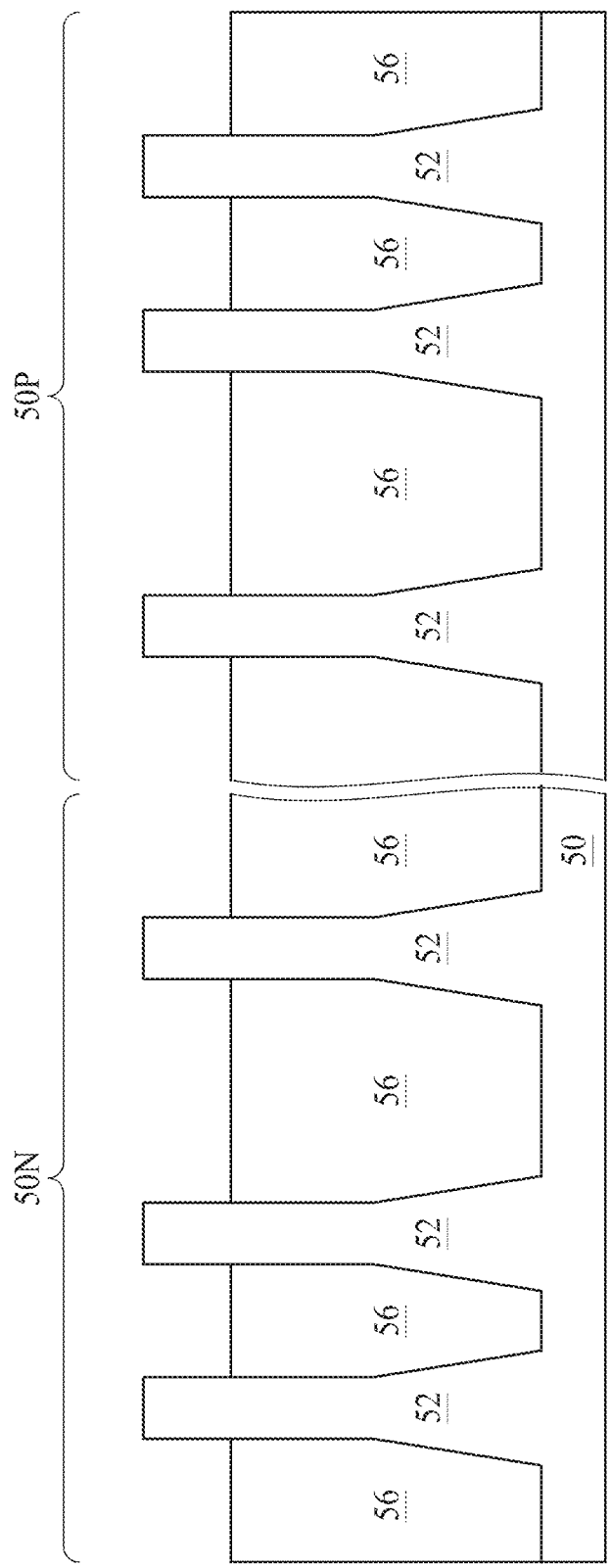

In FIG. 6, the insulation material 54 (see FIG. 5) is recessed to form isolation regions 56. The isolation regions 56 may be also referred to as Shallow Trench Isolation (STI) regions. The insulation material 54 is recessed such that upper portions of fins 52 protrude from between neighboring isolation regions 56. Further, the top surfaces of the isolation regions 56 may have a flat surface as illustrated, a convex surface, a concave surface (such as dishing), or a combination thereof. The top surfaces of the isolation regions 56 may be formed flat, convex, and/or concave by an appropriate etch. The isolation regions 56 may be recessed using an acceptable etch process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2-6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins. For example, the fins 52 in FIG. 5 can be recessed, and a material different from the fins 52 may be epitaxially grown over the recessed fins 52. In such embodiments, the fins comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in the n-type region 50N different from the material in the p-type region 50P. In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, P wells may be formed in the n-type region 50N, and N wells may be formed in the p-type region 50P. In some embodiments, P wells or N wells are formed in both the n-type region 50N and the p-type region 50P. In the embodiments with different well types, the different implant steps for the n-type region 50N and the p-type region 50P may be achieved using a photoresist and/or other masks (not shown). For example, a photoresist may be formed over the fins 52 and the isolation regions 56 in both the n-type region 50N and the p-type region 50P. The photoresist is then patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the regions to a concentration of equal to or less than $10^{18}$ cm$^{-3}$, such as between about $10^{16}$ cm$^{-3}$ and about $10^{18}$ cm$^{-3}$. After the implantation, the photoresist is removed, such as by an acceptable ashing process followed by a wet clean process.

Following the implanting of the p-type region 50P, a photoresist is formed over the fins 52 and the isolation regions 56 in both the n-type region 50N and the p-type region 50P. The photoresist is then patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the regions to a concentration of equal to or less than $10^{18}$ cm$^{-3}$, such as between about $10^{16}$ cm$^{-3}$ and about $10^{18}$ cm$^{-3}$. After the implantation, the photoresist may be removed, such as by an acceptable ashing process followed by a wet clean process.

After performing the implantations of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
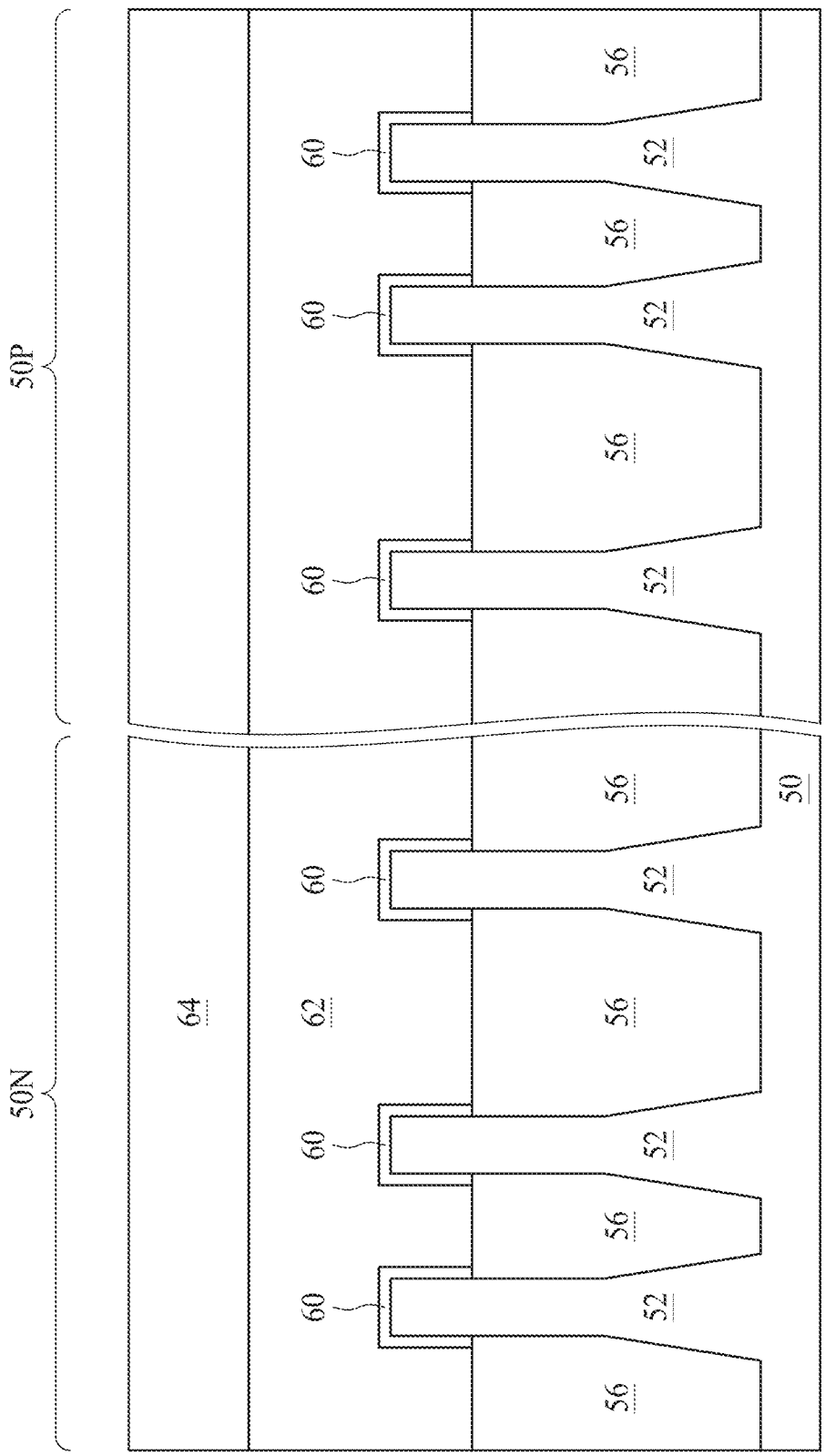

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of the isolation regions 56 and/or the dummy dielectric layer 60. The mask layer 64 may include one or more layers of, for example, silicon oxide, silicon nitride, silicon oxynitride, or the like, and may be deposited by atomic layer deposition (ALD), CVD, or the like. In some embodiments, the mask layer 64 may comprise a layer of silicon nitride and a layer of silicon oxide over the layer of silicon nitride.

In the illustrated embodiment, a single dummy gate layer 62 and a single mask layer 64 are formed across the n-type region 50N and the p-type region 50P. In other embodiments, a dummy gate layer formed in the n-type region 50N is different from a dummy gate layer formed in the p-type region 50P, a mask layer formed in the n-type region 50N is different from a mask layer formed in the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the isolation regions 56, extending over the isolation regions 56 and between the dummy gate layer 62 and the isolation regions 56.

FIGS. 8A, 8B, 9A, 9B, 10A, 10B, 10C, 11A, 11B, 11C, 12A, 12B, 13A, 13B, 14A, 14B, 14C, 15A, 15B, 15C, 15D, 16A, 16B, and 16C illustrate various additional steps in the manufacturing of a FinFET device in accordance with some embodiments. FIGS. 8A, 8B, 9A, 9B, 10A, 10B, 10C, 11A, 11B, 11C, 12A, 12B, 13A, 13B, 14A, 14B, 14C, 15A, 15B, 15C, 15D, 16A, 16B, and 16C illustrate features in either of the n-type region 50N and the p-type region 50P of the substrate 50. For example, the structures illustrated in FIGS. 8A, 8B, 9A, 9B, 10A, 10B, 10C, 11A, 11B, 11C, 12A, 12B, 13A, 13B, 14A, 14B, 14C, 15A, 15B, 15C, 15D, 16A, 16B, and 16C may be applicable to both the n-type region 50N and the p-type region 50P of the substrate 50. Differences (if any) in the structures of the n-type region 50N and the p-type region 50P are described in the text accompanying each figure.

Figure 8B:
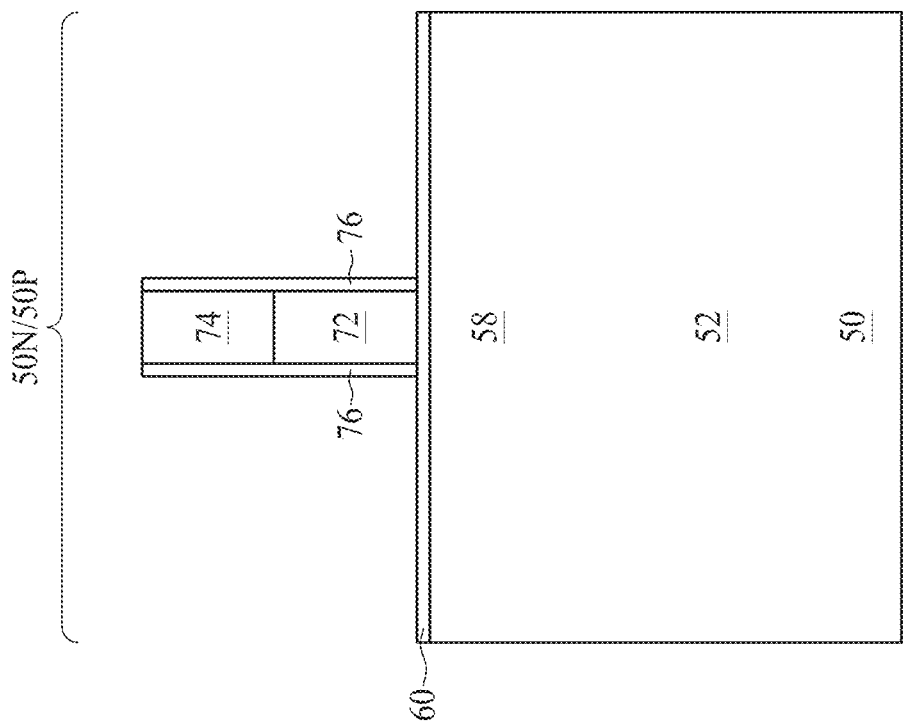
Figure 8A:
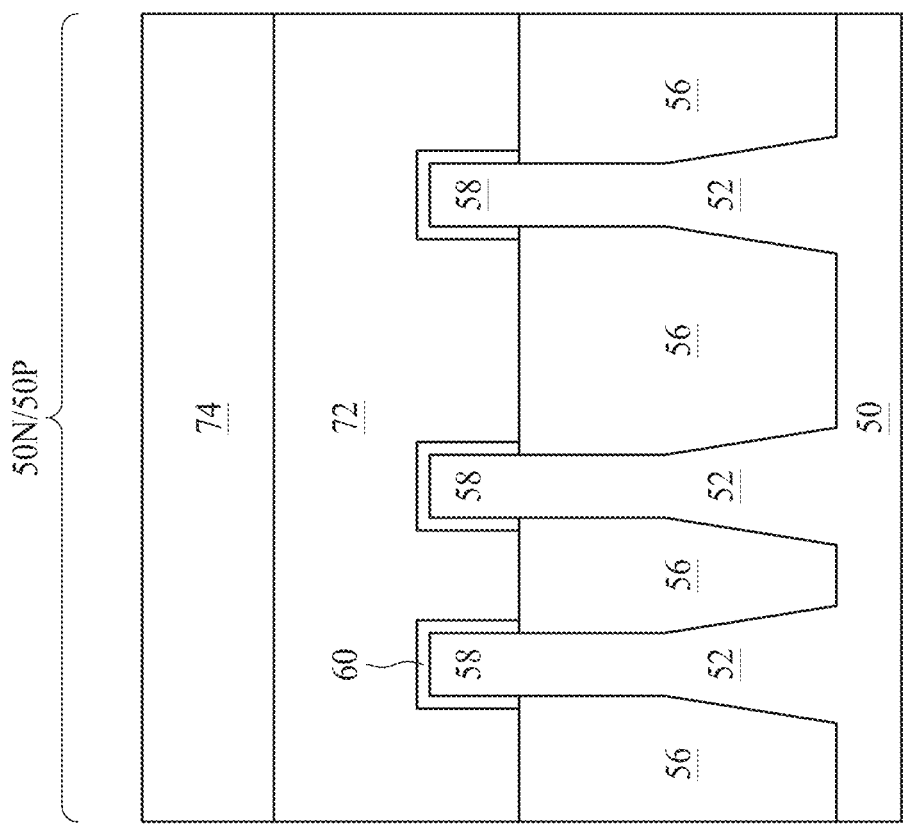

In FIGS. 8A and 8B, the mask layer 64 (see FIG. 7) may be patterned using acceptable photolithography and etching techniques to form masks 74. The pattern of the masks 74 then may be transferred to the dummy gate layer 62 (see FIG. 7) to form dummy gates 72. In some embodiments (not illustrated), the pattern of the masks 74 may also be transferred to the dummy dielectric layer 60 by an acceptable etching technique. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective fins 52.

Further in FIGS. 8A and 8B, gate seal spacers 76 can be formed on exposed surfaces of the dummy gates 72, the masks 74, and/or the fins 52. A thermal oxidation or a deposition (such as, for example, ALD, CVD, or the like) followed by an anisotropic etch may form the gate seal spacers 76. The gate seal spacers 76 may be formed of silicon oxide, silicon nitride, silicon oxynitride, or the like.

After the formation of the gate seal spacers 76, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities from about $10^{15}$ cm$^{-3}$ to about $10^{19}$ cm$^{-3}$. An anneal may be used to repair implant damage and to activate the implanted impurities.

Figure 9B:
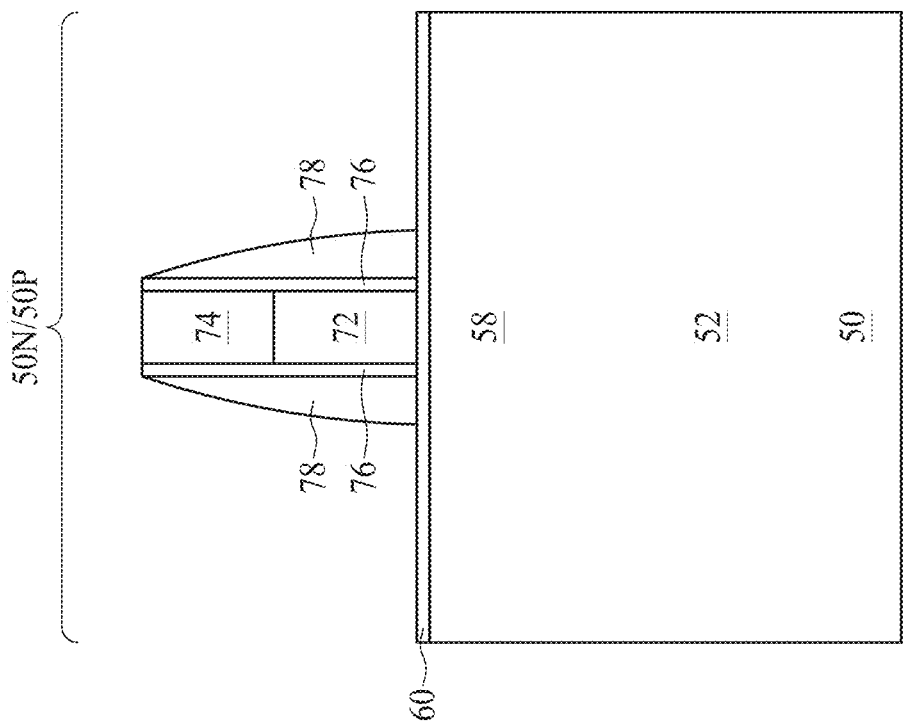
Figure 9A:
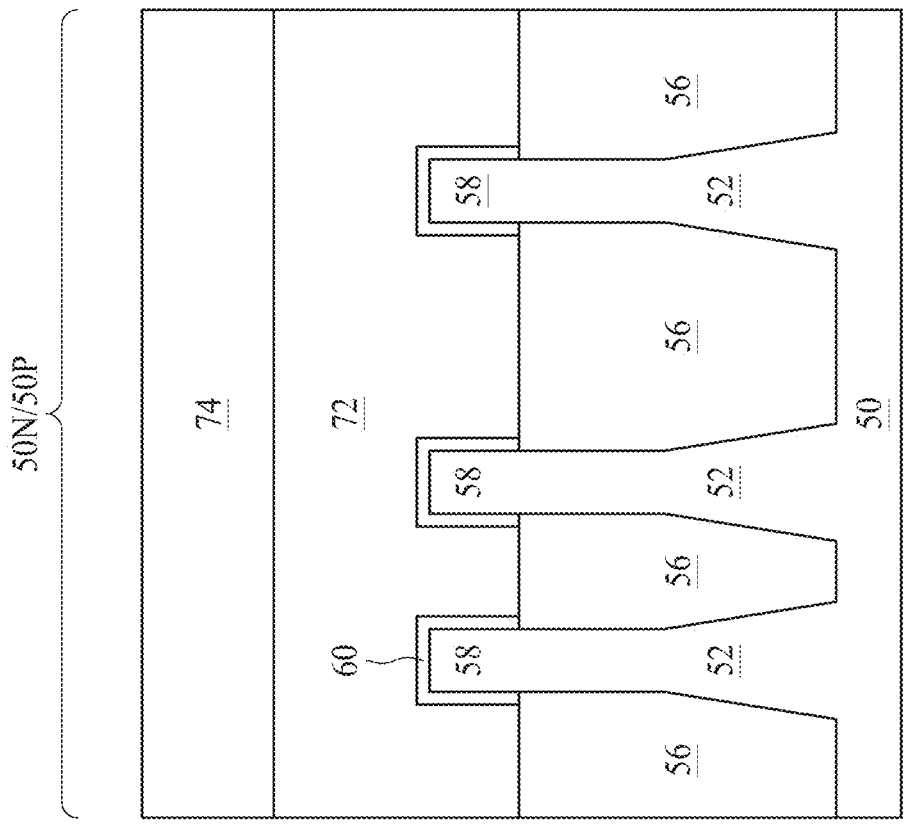

In FIGS. 9A and 9B, gate spacers 78 are formed on the gate seal spacers 76 along sidewalls of the dummy gates 72 and the masks 74. The gate spacers 78 may be formed by blanket depositing an insulating material and subsequently anisotropically etching the insulating material. The insulating material of the gate spacers 78 may be silicon oxide, silicon nitride, silicon oxynitride, silicon carbonitride, a combination thereof, or the like, and may be deposited by ALD, CVD, or the like. In some embodiments, the gate spacers 78 and the gate seal spacers 76 comprise a same material. In other embodiments, the gate spacers 78 and the gate seal spacers 76 comprise different materials.

It is noted that the above disclosure generally describes a process of forming spacers and LDD regions. Other processes and sequences may be used. For example, fewer or additional spacers may be utilized, or different sequence of steps may be utilized (e.g., the gate seal spacers 76 may not be etched prior to forming the gate spacers 78, yielding "L-shaped" gate seal spacers, spacers may be formed and removed, and/or the like). Furthermore, the n-type and p-type devices may be formed using a different structures and steps. For example, the LDD regions for n-type devices may be formed prior to forming the gate seal spacers 76, while the LDD regions for p-type devices may be formed after forming the gate seal spacers 76.

Figure 10B:
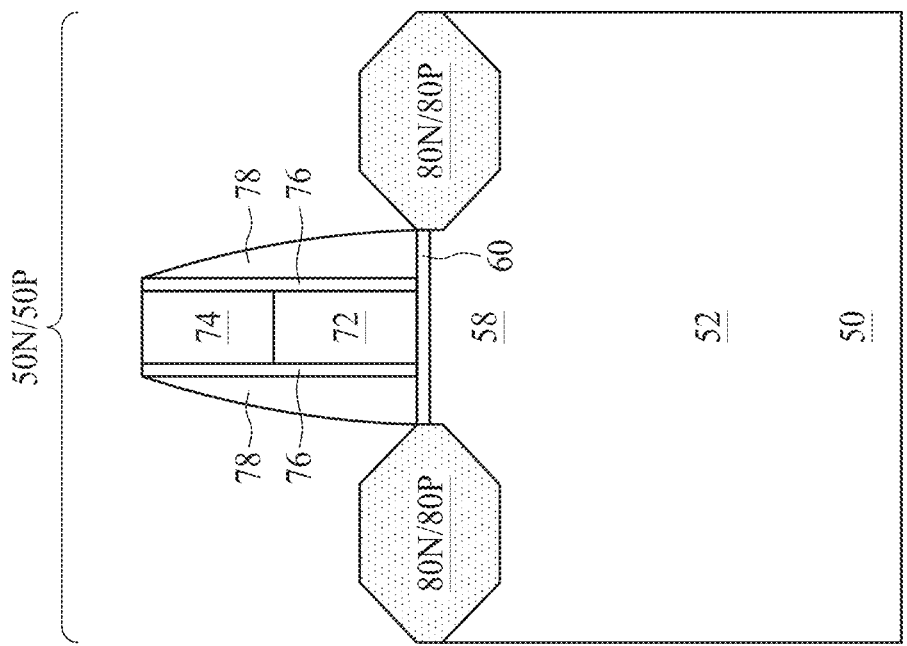
Figure 10A:
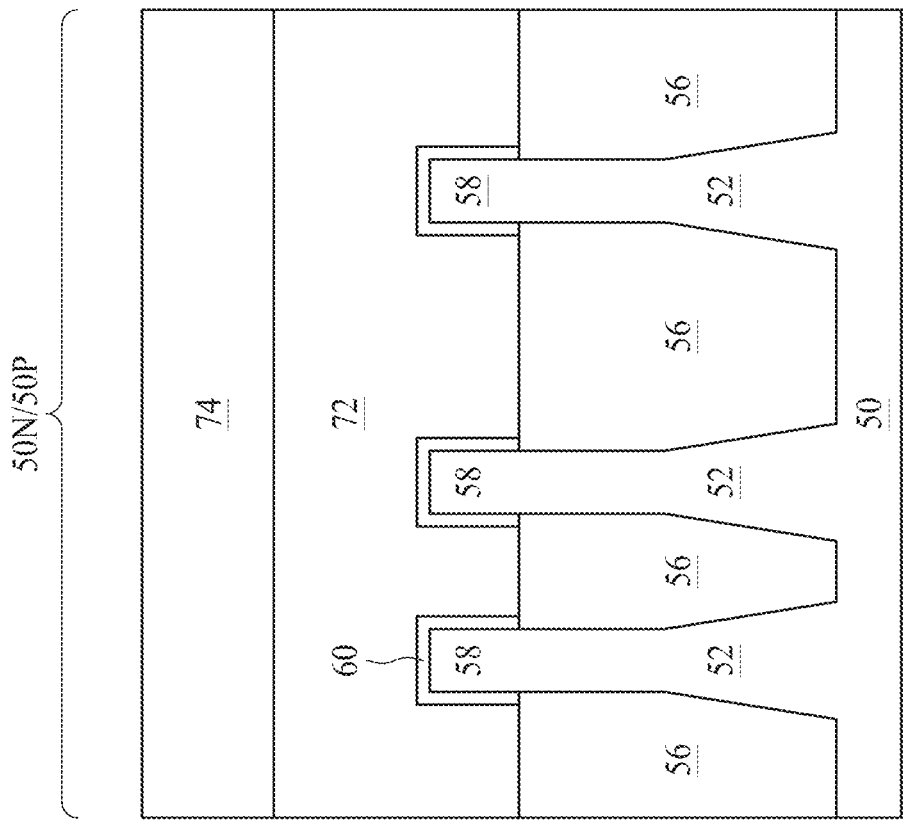
Figure 10C:
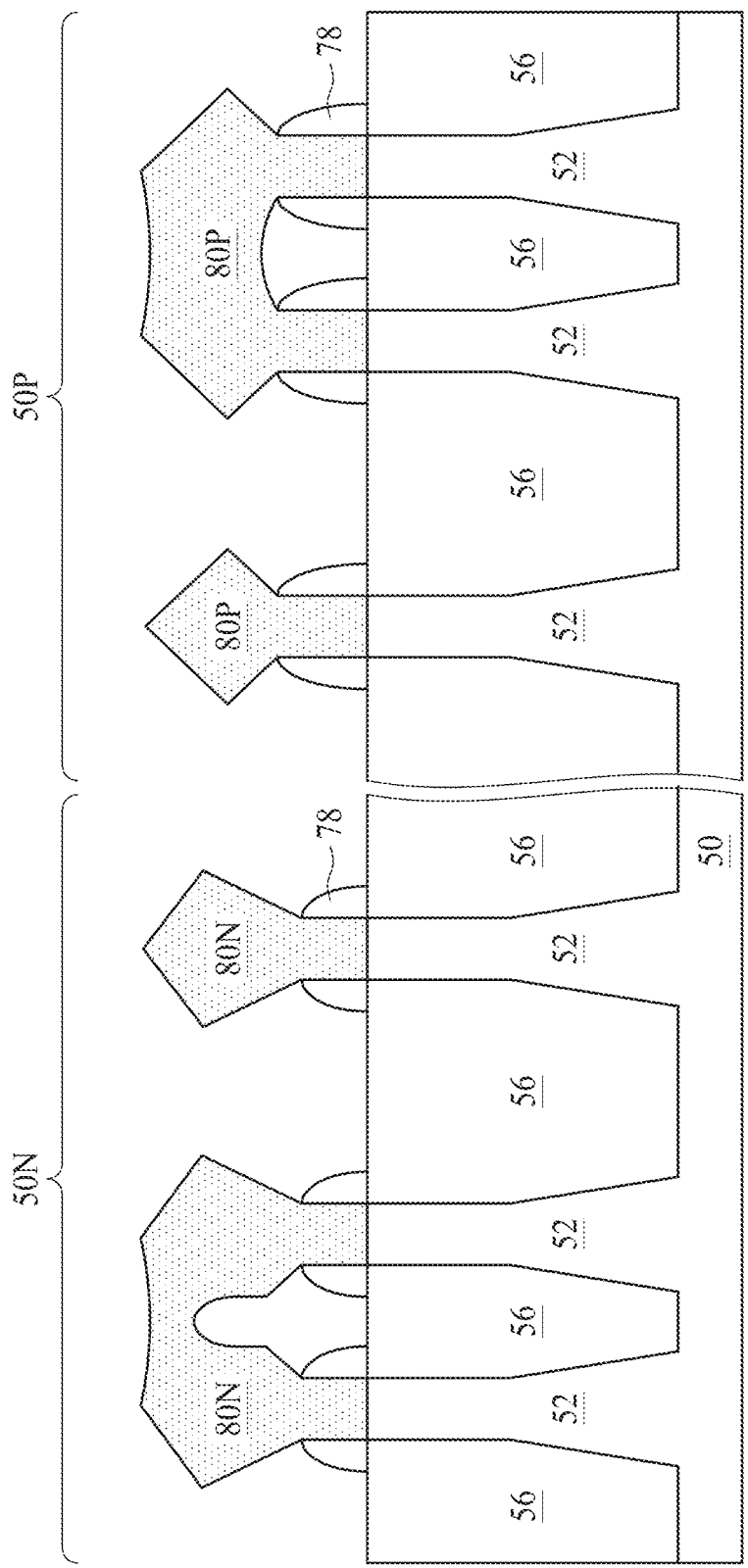

In FIGS. 10A, 10B and 10C, epitaxial source/drain regions 80N are formed in the fins 52 in the n-type region 50N, and epitaxial source/drain regions 80P are formed in the fins 52 in the p-type region 50P. The epitaxial source/drain regions 80N may be also referred to as n-type epitaxial source/drain regions. The epitaxial source/drain regions 80P may be also referred to as p-type epitaxial source/drain regions. The epitaxial source/drain regions 80N and 80P are formed in the fins 52 such that each dummy gate 72 is disposed between respective neighboring pairs of the epitaxial source/drain regions 80N and 80P. In some embodiments the epitaxial source/drain regions 80N and 80P may extend into, and may also penetrate through, the fins 52. In some embodiments, the gate spacers 78 are used to separate the epitaxial source/drain regions 80N and 80P from the dummy gates 72 by an appropriate lateral distance so that the epitaxial source/drain regions 80N and 80P do not short out subsequently formed gates of the resulting FinFETs. A material of the epitaxial source/drain regions 80N and 80P may be selected to exert stress in the respective channel regions 58, thereby improving performance.

The epitaxial source/drain regions 80N in the n-type region 50N may be formed by masking the p-type region 50P and etching source/drain regions of the fins 52 in the n-type region 50N to form recesses in the fins 52. Then, the epitaxial source/drain regions 80N are epitaxially grown in the recesses. The epitaxial source/drain regions 80N may include any acceptable material, such as appropriate for n-type FinFETs. For example, if the fin 52 is made of silicon, the epitaxial source/drain regions 80N may include materials exerting a tensile strain in the channel region 58, such as silicon, silicon carbide, phosphorous doped silicon carbide, silicon phosphide, or the like. The epitaxial source/drain regions 80N may have surfaces raised from respective surfaces of the fins 52 and may have facets.

The epitaxial source/drain regions 80P in the p-type region 50P may be formed by masking the n-type region 50N and etching source/drain regions of the fins 52 in the p-type region 50P to form recesses in the fins 52. Then, the epitaxial source/drain regions 80P are epitaxially grown in the recesses. The epitaxial source/drain regions 80P may include any acceptable material, such as appropriate for p-type FinFETs. For example, if the fin 52 is made of silicon, the epitaxial source/drain regions 80P may comprise materials exerting a compressive strain in the channel region 58, such as silicon-germanium, boron doped silicon-germanium, germanium, germanium tin, or the like. The epitaxial source/drain regions 80P may have surfaces raised from respective surfaces of the fins 52 and may have facets.

The epitaxial source/drain regions 80N and 80P and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 80N and 80P may be in situ doped during growth.

As a result of the epitaxy processes used to form the epitaxial source/drain regions 80N in the n-type region 50N and the epitaxial source/drain regions 80P in the p-type region 50P, upper surfaces of the epitaxial source/drain regions 80N and 80P have facets which expand laterally outward beyond sidewalls of the fins 52. In some embodiments, these facets cause adjacent source/drain regions 80N and 80P of a same FinFET to merge as illustrated in FIG. 10C. In some embodiments, gate spacers 78 are formed covering a portion of the sidewalls of the fins 52 that extend above the isolation regions 56 both in the n-type region 50N and the p-type region 50P, thereby blocking the epitaxial growth. In some embodiments, a height of the gate spacers 78 in the n-type region 50N is less than a height of the gate spacers 78 in the p-type region 50P. In such embodiments, the height difference between the gate spacers 78 may case the epitaxial source/drain regions 80N and the epitaxial source/drain regions 80P to have different shapes as illustrated in FIG. 10C. In other embodiments, the spacer etch used to form the gate spacers 78 may be adjusted to remove the spacer material from a portion of the sidewalls of the fins 52 that extend above the isolation regions 56 in either or both of the n-type region 50N and the p-type region 50P.

Figure 11C:
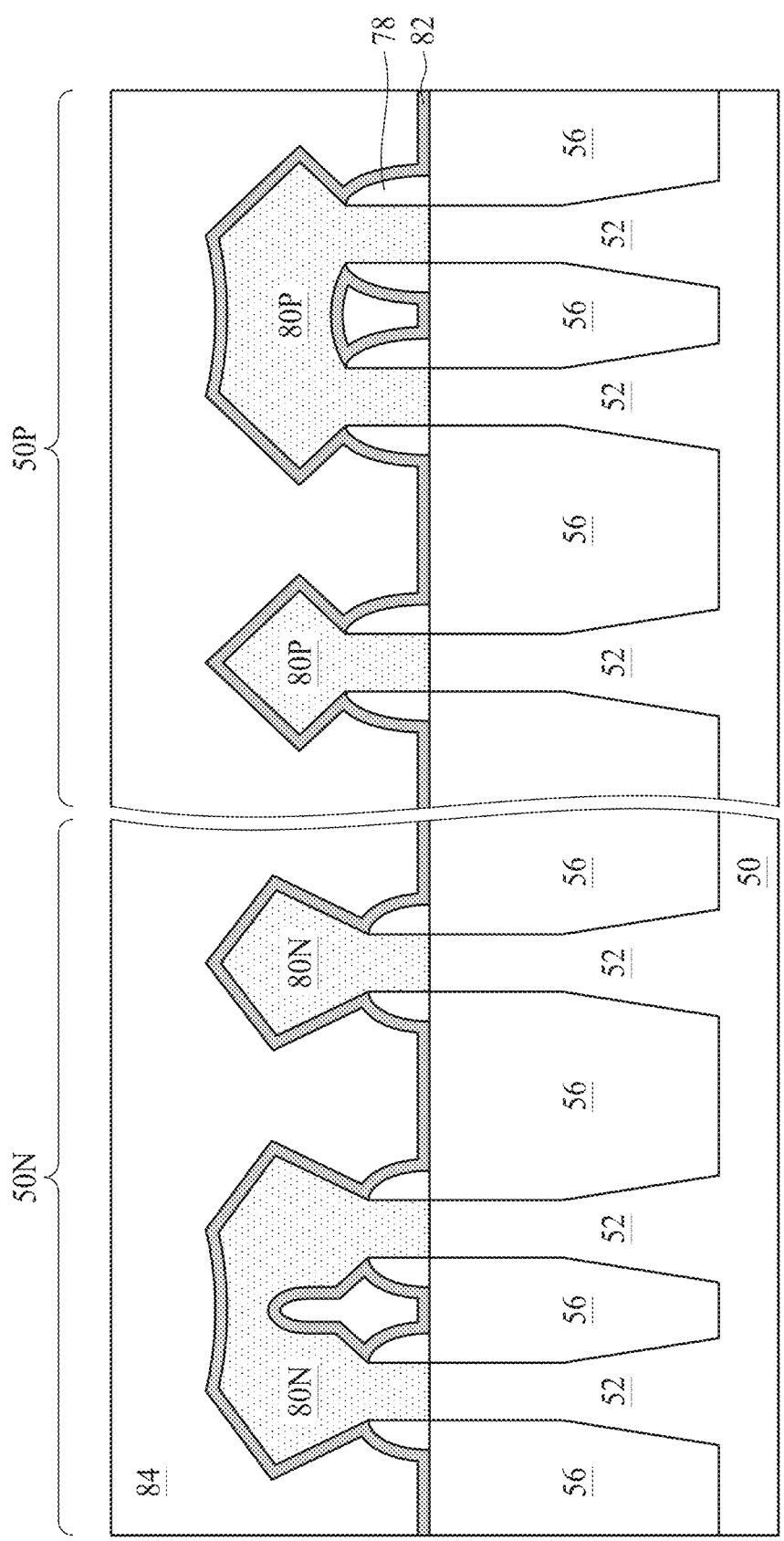

In FIGS. 11A, 11B and 11C, a first interlayer dielectric (ILD) 84 is deposited over the structure illustrated in FIGS. 10A, 10B and 10C. The first ILD 84 may be formed of a dielectric material, and may be deposited by any suitable method, such as CVD, plasma-enhanced CVD (PECVD), FCVD, a combination thereof, or the like. Dielectric materials may include silicon oxide, silicon nitride, phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 82 is disposed between the first ILD 84 and the epitaxial source/drain regions 80N and 80P, the masks 74, and the gate spacers 78. The CESL 82 may comprise a dielectric material, such as, silicon nitride, silicon oxide, silicon oxynitride, or the like, having a lower etch rate than the material of the overlying first ILD 84.

Figure 12B:
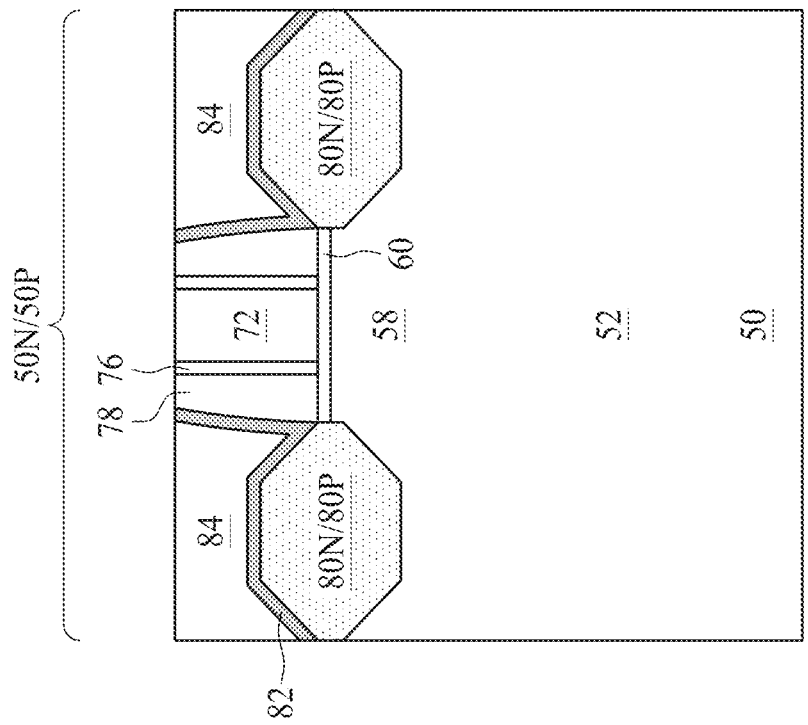
Figure 12A:
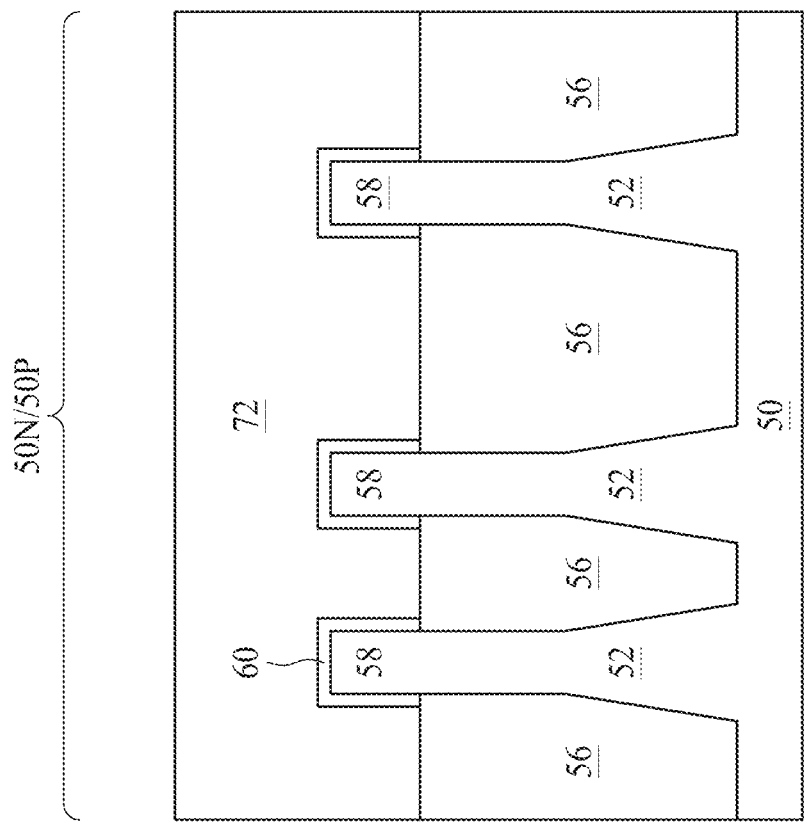

In FIGS. 12A and 12B, a planarization process, such as a CMP, may be performed to level a top surface of the first ILD 84 with top surfaces of the dummy gates 72 or the masks 74 (see FIGS. 11A and 11B). The planarization process may also remove the masks 74 on the dummy gates 72, and portions of the CESL 82, the gate seal spacers 76 and the gate spacers 78 along sidewalls of the masks 74. After the planarization process, top surfaces of the dummy gates 72, the gate seal spacers 76, the gate spacers 78, the CESL 82, and the first ILD 84 are substantially level or coplanar within process variations of the planarization process. Accordingly, the top surfaces of the dummy gates 72 are exposed through the first ILD 84. In some embodiments, the masks 74 may remain on the dummy gates 72, in which case the planarization process levels the top surface of the first ILD 84 with top surfaces of the masks 74.

Figure 13B:
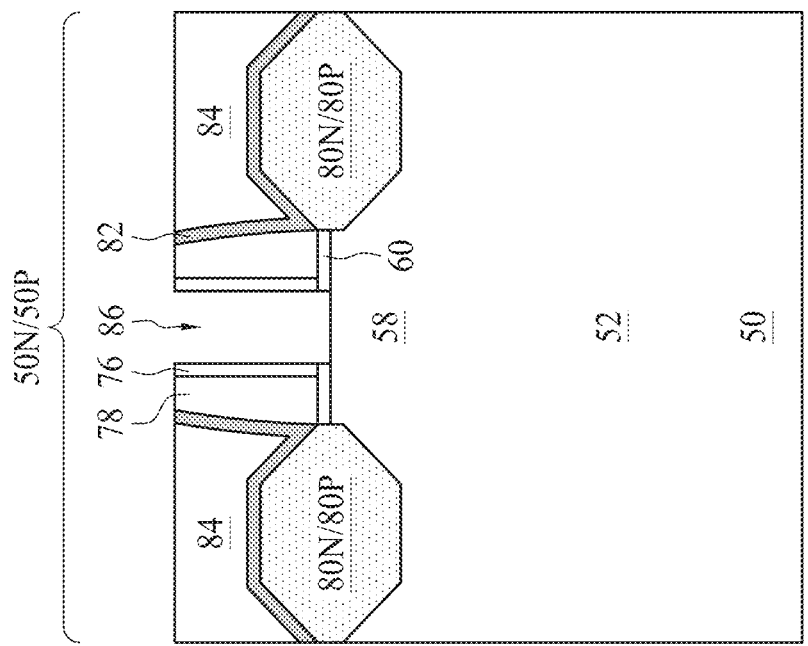
Figure 13A:
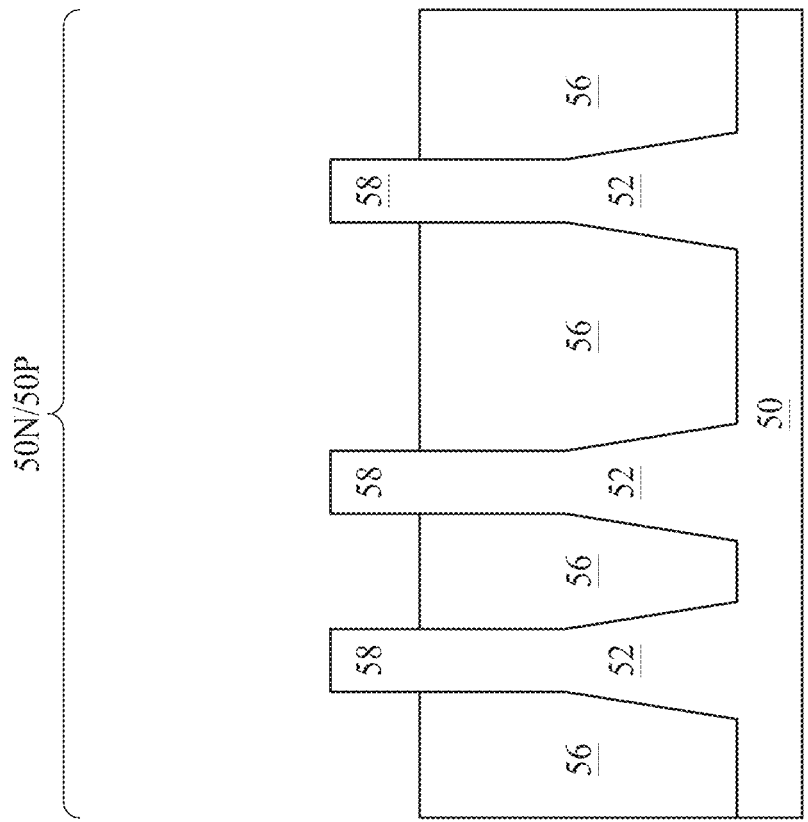

In FIGS. 13A and 13B, the dummy gates 72, and the masks 74 (see FIGS. 12A and 12B) if present, are removed in an etching step(s), so that recesses 86 are formed. Portions of the dummy dielectric layer 60 in the recesses 86 may also be removed. In some embodiments, only the dummy gates 72 are removed and the dummy dielectric layer 60 remains and is exposed by the recesses 86. In some embodiments, the dummy gates 72 are removed by an anisotropic dry etch process. For example, the etch process may include a dry etch process using reaction gas(es) that selectively etch the dummy gates 72 with little or no etching of the first ILD 84, the CESL 82, the gate seal spacers 76, or the gate spacers 78. Each recess 86 exposes and/or overlies a channel region 58 of a respective fin 52. Each channel region 58 is disposed between neighboring pairs of the epitaxial source/drain regions 80N and 80P. During the removal, the dummy dielectric layer 60 may be used as an etch stop layer when the dummy gates 72 are etched. The dummy dielectric layer 60 may then be optionally removed after the removal of the dummy gates 72.

Figure 14B:
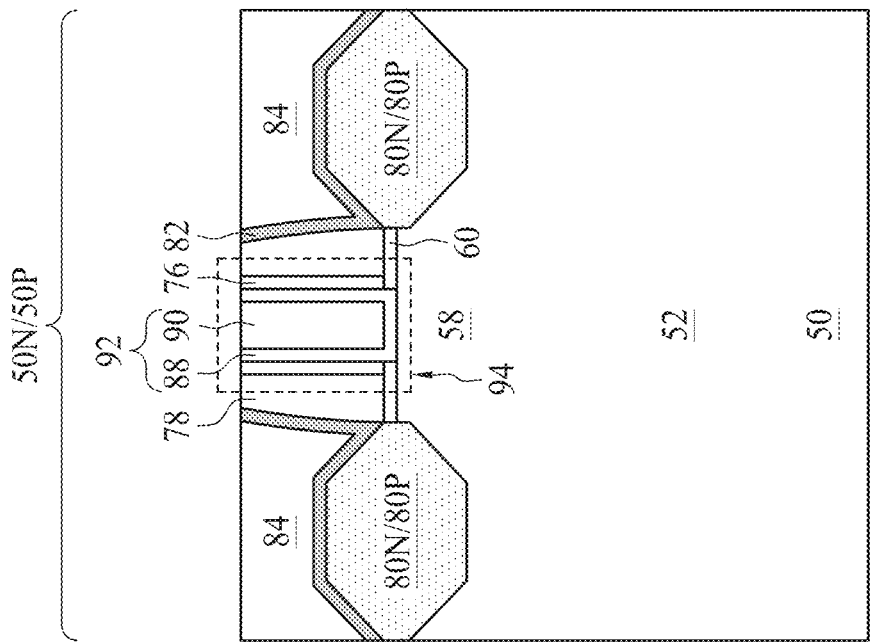
Figure 14A:
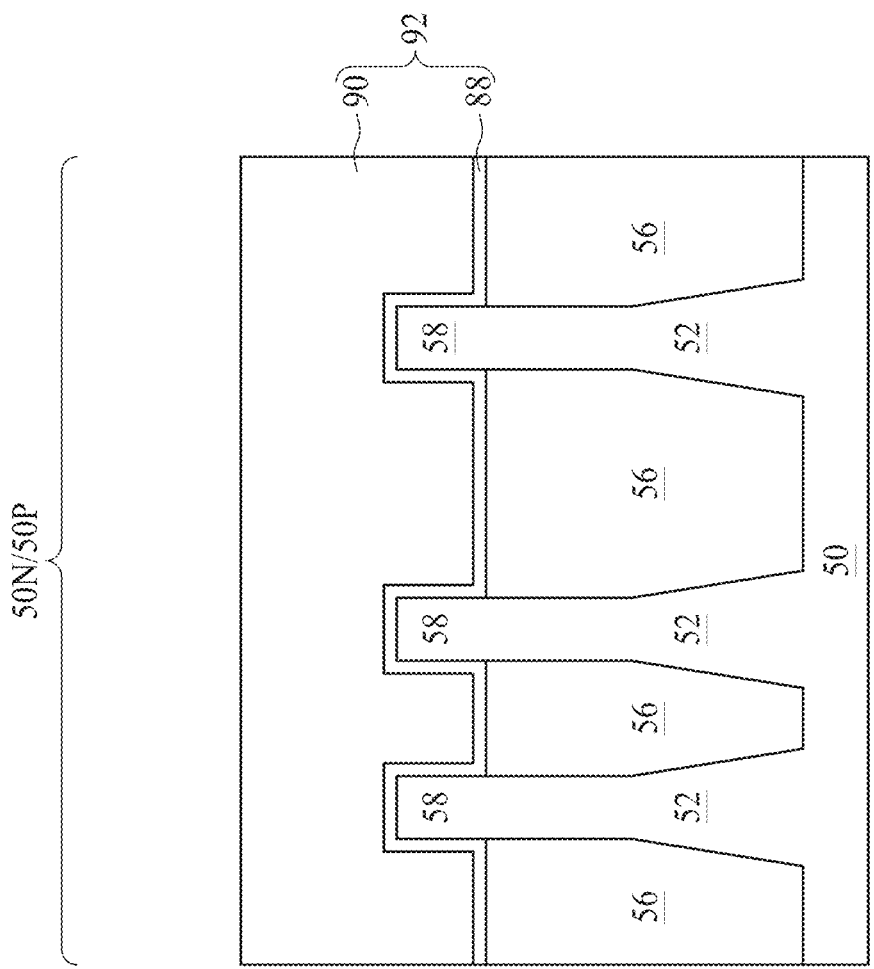
Figure 14C:
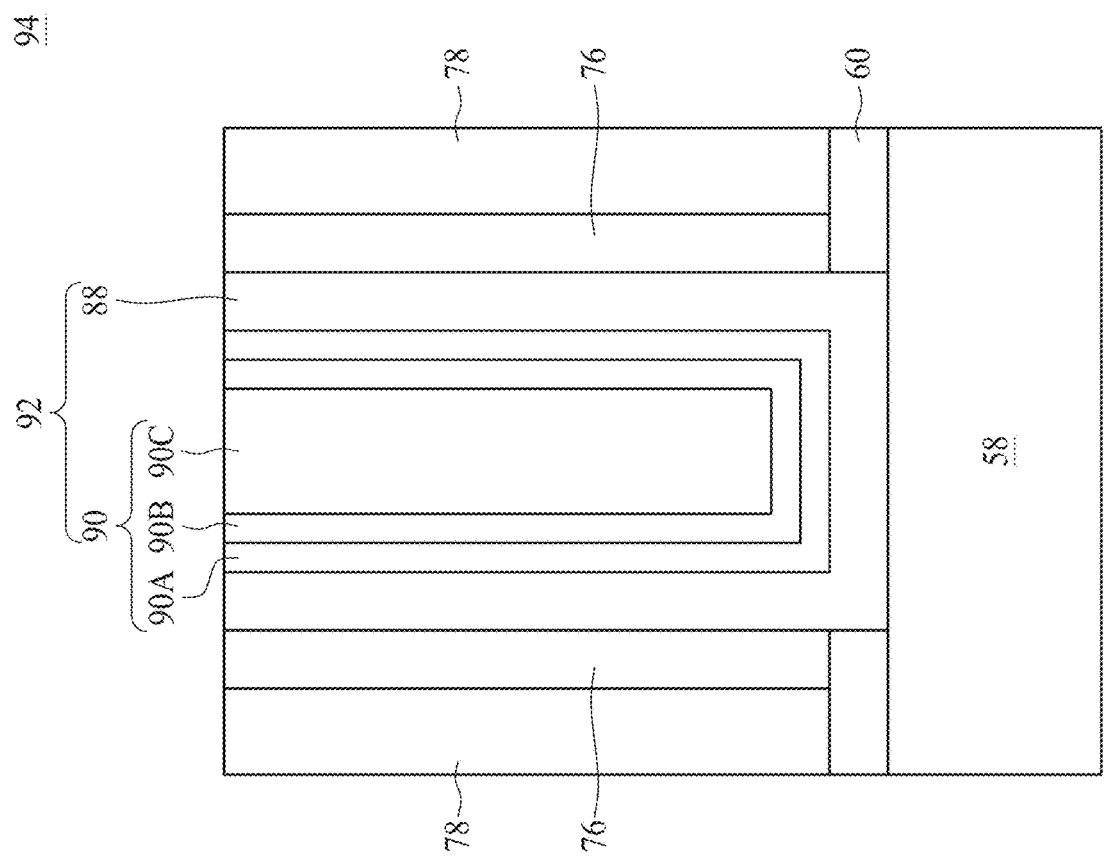

In FIGS. 14A and 14B, gate dielectric layers 88 and gate electrodes 90 are formed in the recesses 86 (see FIGS. 13A and 13B) to form replacement gate stacks 92. FIG. 14C illustrates a detailed view of a region 94 of FIG. 14B. The replacement gate stacks 92 may be also referred to as gate stacks or metal gate stacks. In some embodiments, all of the dummy gates 72 (see FIGS. 12A and 12B) are replaced with the replacement gate stacks 92. In other embodiments, some of the dummy gates 72 are not replaced by the replacement gate stacks 92 and remain in the final structure of the resulting FinFET device.

In some embodiments, the gate dielectric layers 88 are deposited in the recesses 86, such as on the top surfaces and the sidewalls of the fins 52 and on sidewalls of the gate seal spacers 76/gate spacers 78. The gate dielectric layers 88 may also be formed on the top surface of the first ILD 84. In some embodiments, the gate dielectric layers 88 comprise one or more dielectric layers, such as one or more layers of silicon oxide, silicon nitride, metal oxide, metal silicate, or the like. In some embodiments, the gate dielectric layers 88 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, or combinations thereof. The high-k dielectric material may have a k value greater than about 7.0. The formation methods of the gate dielectric layers 88 may include Molecular-Beam Deposition (MBD), ALD, PECVD, or the like. In embodiments where portions of the dummy dielectric layer 60 remain in the recesses 86, the gate dielectric layers 88 include a material of the dummy dielectric layer 60 (e.g., SiO$_2$).

The gate electrodes 90 are deposited over the gate dielectric layers 88 and fill the remaining portions of the recesses 86 (see FIGS. 13A and 13B). Although single layer gate electrodes 90 are illustrated in FIGS. 14A and 14B, each of the gate electrodes 90 may comprise any number of liner layers 90A, any number of work function tuning layers 90B, and a conductive fill layer 90C as illustrated by FIG. 14C. The liner layers 90A may include TiN, TiO, TaN, TaC, combinations thereof, multi-layers thereof, or the like, and may be formed using PVD, CVD, ALD, a combination thereof, or the like. In the n-type region 50N of the substrate 50, the work function tuning layers 90B may include Ti, Ag, Al, TiAl, TiAlN, TiAlC, TaC, TaCN, TaSiN, TaAlC, Mn, Zr, combinations thereof, multi-layers thereof, or the like, and may be formed using PVD, CVD, ALD, a combination thereof, or the like. In the p-type region 50P of the substrate 50, the work function tuning layers 90B may include TiN, WN, TaN, Ru, Co, combinations thereof, multi-layers thereof, or the like, and may be formed using PVD, CVD, ALD, a combination thereof, or the like. In some embodiments, the conductive fill layer 90C may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, a combination thereof, or the like.

After the filling of the recesses 86 (see FIGS. 13A and 13B), a planarization process, such as a CMP process, may be performed to remove excess portions of the gate dielectric layers 88 and the gate electrodes 90, which excess portions are over the top surface of the first ILD 84. The remaining portions of the gate electrodes 90 and the gate dielectric layers 88 thus form replacement gate stacks 92 of the resulting FinFETs. After the planarization process, top surfaces of the replacement gate stacks 92 are substantially level or coplanar with the top surface of the first ILD 84 within process variations of the planarization process.

The formation of the gate dielectric layers 88 in the n-type region 50N and the p-type region 50P of the substrate 50 may occur simultaneously such that the gate dielectric layers 88 in each region are formed of the same materials. In other embodiments, the gate dielectric layers 88 in each region may be formed by distinct processes such that the gate dielectric layers 88 in different regions may be formed of different materials. The formation of the conductive fill layers 90C in the n-type region 50N and the p-type region 50P of the substrate 50 may occur simultaneously such that the conductive fill layers 90C in each region are formed of the same materials. In other embodiments, the conductive fill layers 90C in each region may be formed by distinct processes such that the conductive fill layers 90C in different regions may be formed of different materials. Various masking steps may be used to mask and expose appropriate regions when using distinct processes.

Figure 15B:
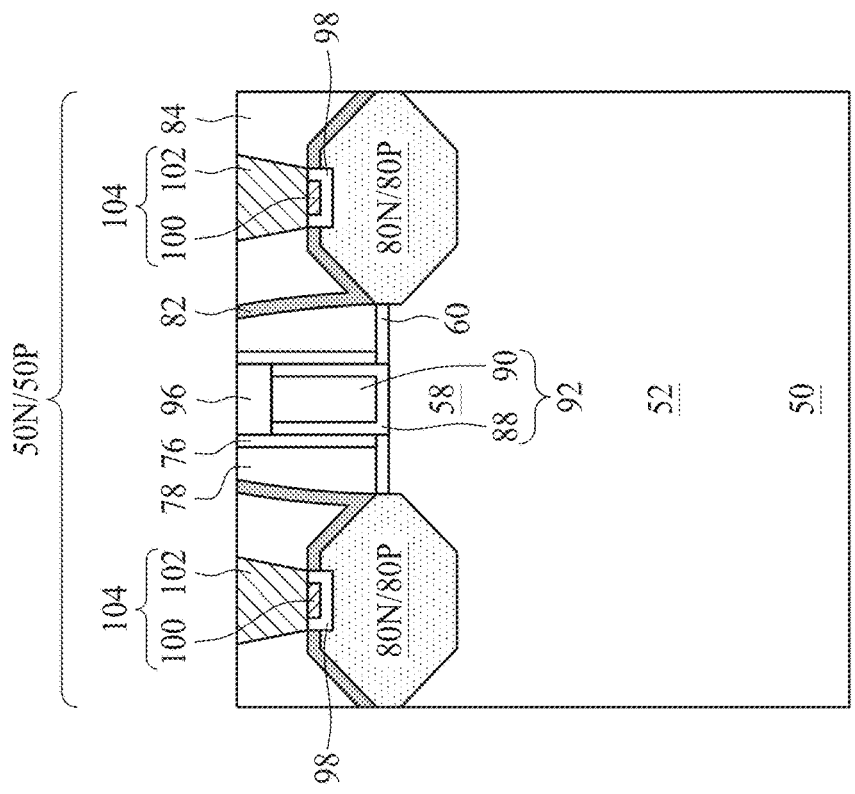
Figure 15A:
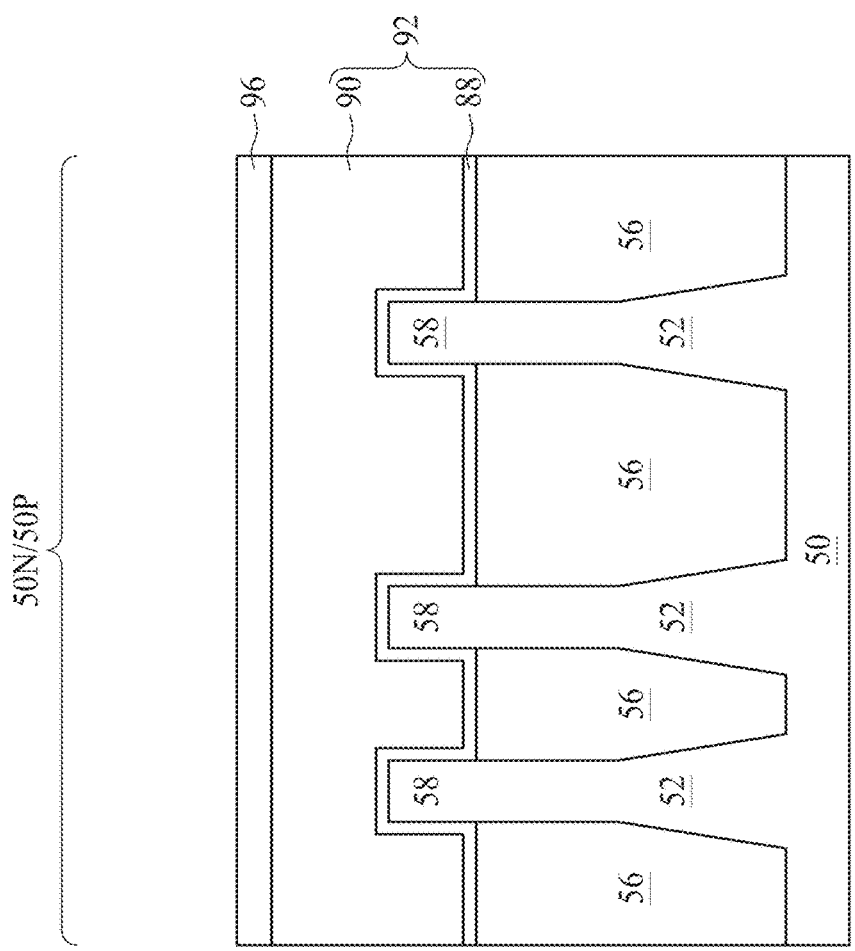
Figure 15C:
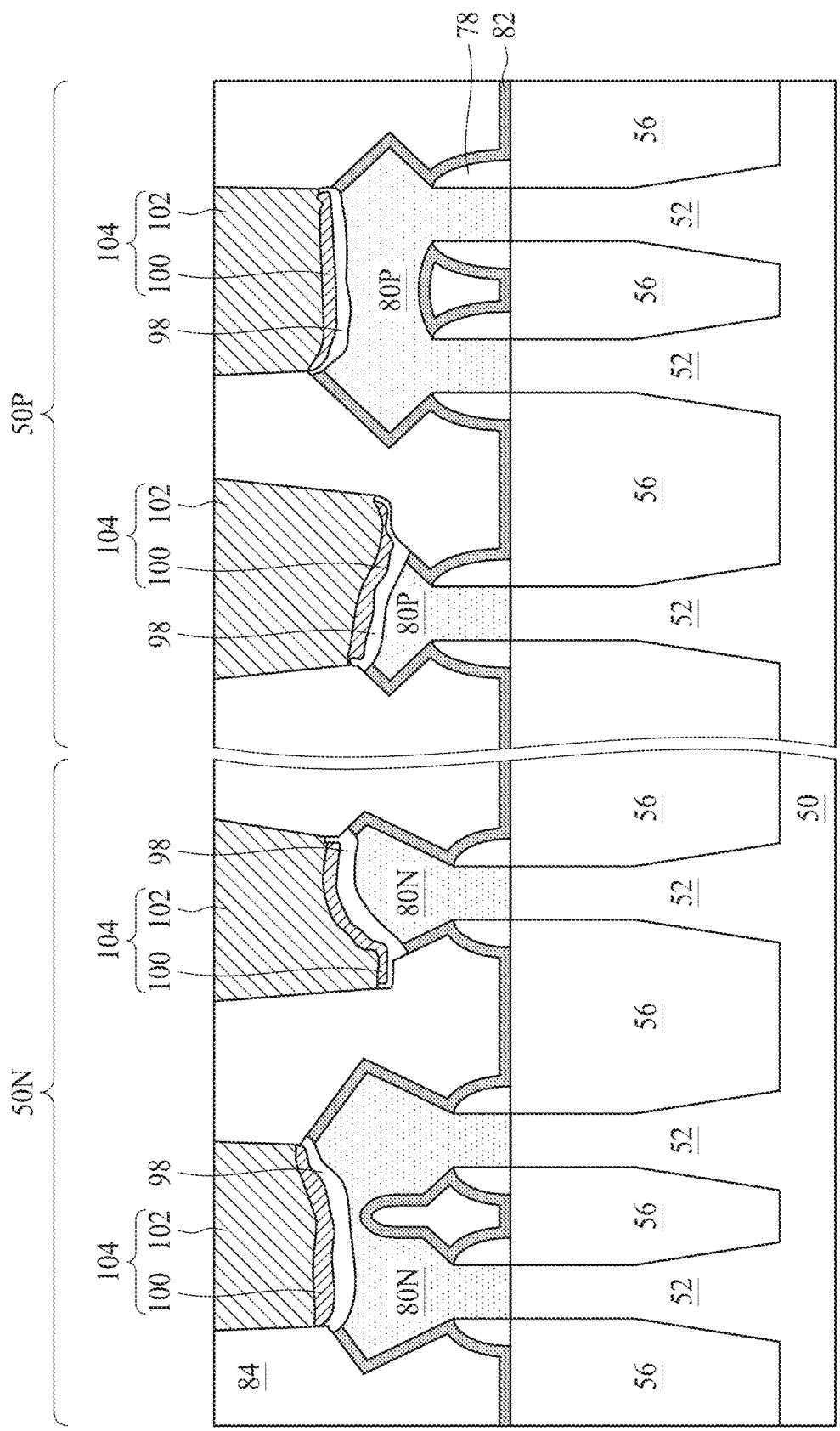
Figure 15D:
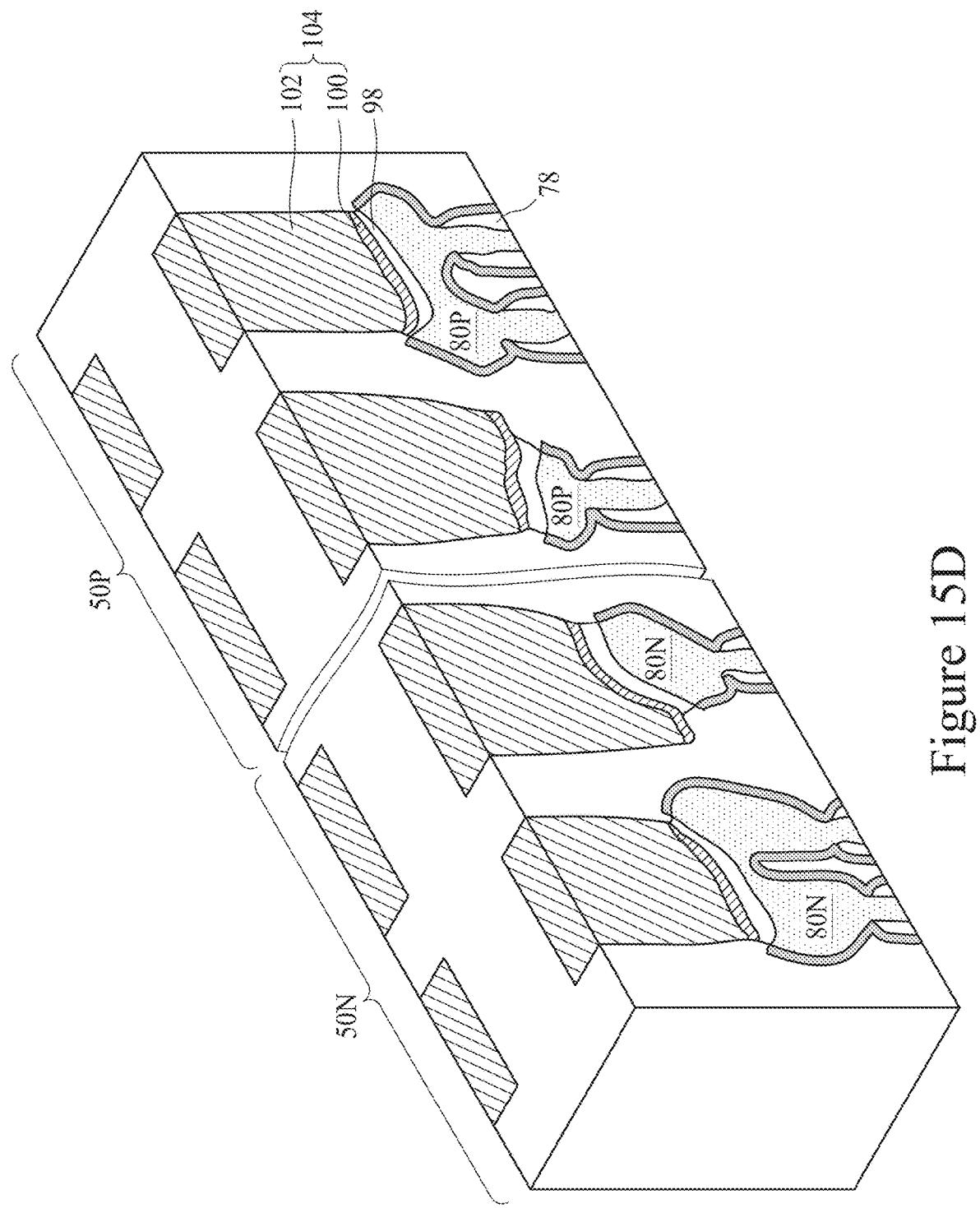

In FIGS. 15A, 15B and 15C, gate masks 96 are formed over the gate stacks 92 and between opposing portions of the gate seal spacers 76/gate spacers 78. In some embodiments, the gate stacks 92 are recessed, so that recesses are formed directly over the gate stacks 92 and between opposing portions of the gate seal spacers 76/gate spacers 78. The gate masks 96 comprising one or more layers of a dielectric material, such as silicon nitride, silicon oxynitride, a combination thereof, or the like, are filled in the recesses, followed by a planarization process to remove excess portions of the dielectric material extending over the first ILD 84. After the planarization process, top surfaces of the gate masks 96 are substantially level or coplanar with the top surface of the first ILD 84 within process variations of the planarization process.

Further in FIGS. 15A, 15B and 15C, contact features 104 are formed in the first ILD 84 and in electrical contact with respective epitaxial source/drain regions 80N and 80P. The contact features 104 may be also referred to as source/drain contacts or source/drain contact plugs. In some embodiments, openings for the contact features 104 are formed through the CESL 82 and the first ILD 84. In some embodiments, the openings may also extend into respective epitaxial source/drain regions 80N and 80P. The openings may be formed using acceptable photolithography and etch techniques. The etch may be anisotropic.

In some embodiments, after forming the openings, silicide layers 98 are formed over the epitaxial source/drain regions 80N and 80P in the openings. After forming the silicide layers 98, the contact features 104 are formed over the silicide layers 98 in the openings. In some embodiments, each of the contact features 104 comprises a conductive liner 100 and a conductive fill material 102 over the conductive liner 100. The conductive liner 100 may be also referred to as a seed/barrier layer. In some embodiments, the silicide layers 98 and the contact features 104 (including the conductive liners 100 and the conductive fill materials 102) are formed as described below with reference to FIGS. 17A-25A and 17B-25B, and the detailed description is provided at that time. Although shown as being formed in the same cross-sections, it should be appreciated that each of the contact features 104 may be formed in different cross-sections, which may avoid shorting of the contact features.

FIG. 15D illustrates a three-dimensional view of the epitaxial source/drain regions 80N and 80P and respective contact features 104, in accordance with some embodiments. A layout or arrangement of the epitaxial source/drain regions 80N and 80P and respective contact features 104 as illustrated in FIG. 15D is provided as an example. In other embodiments, the epitaxial source/drain regions 80N and 80P and respective contact features 104 may have any desired layout or arrangement, such as symmetrical, staggered, or the like.

Figure 16B:
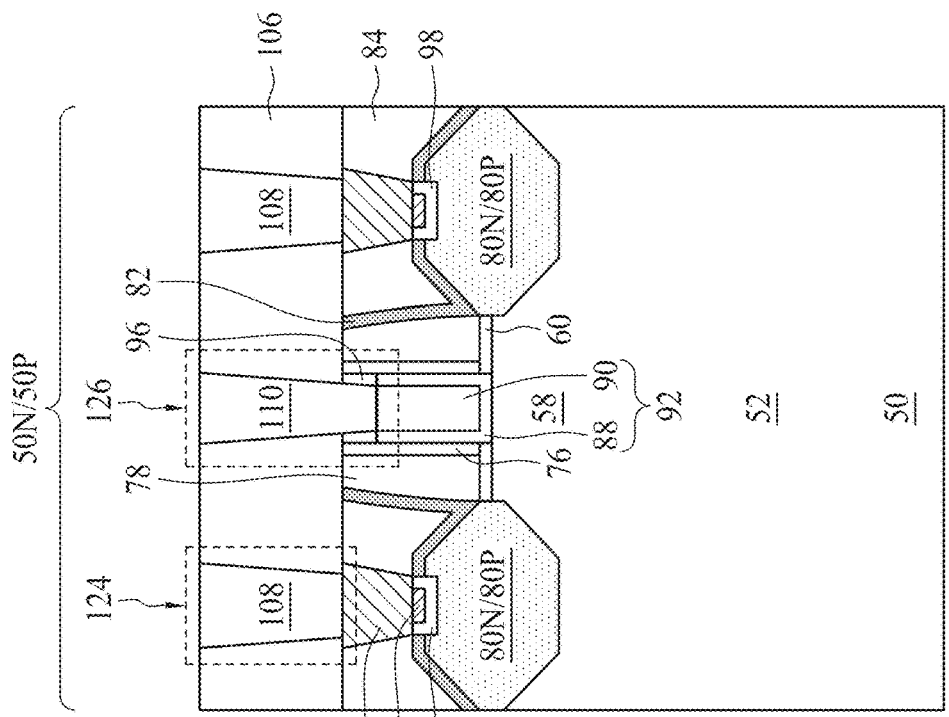
Figure 16A:
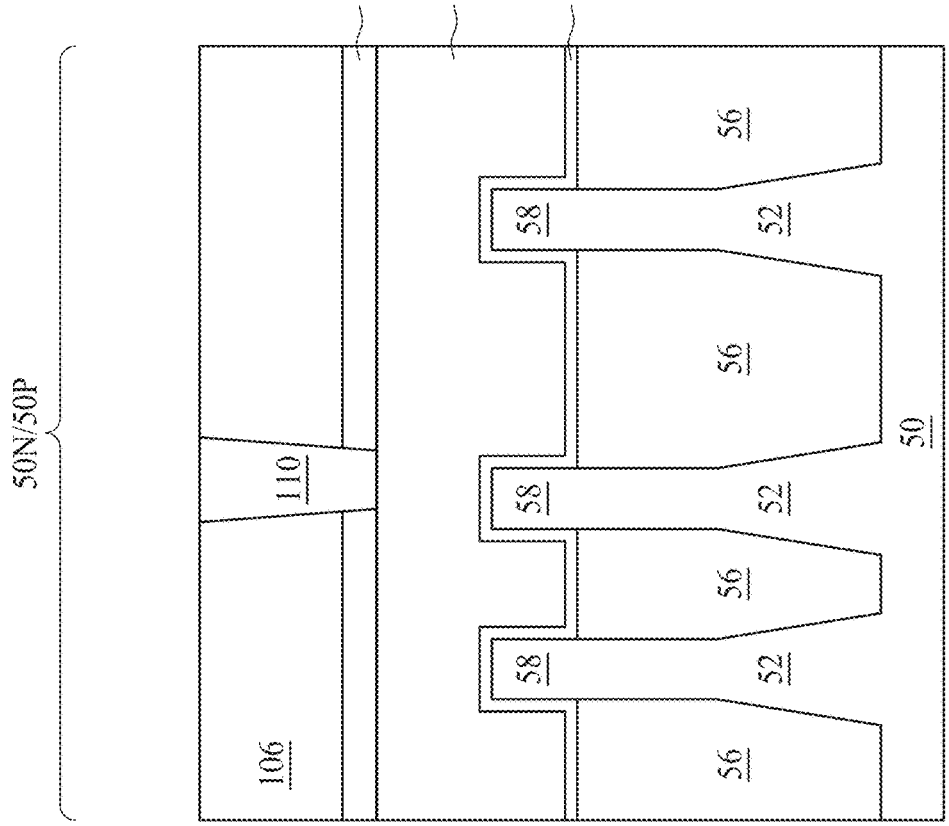
Figure 16C:
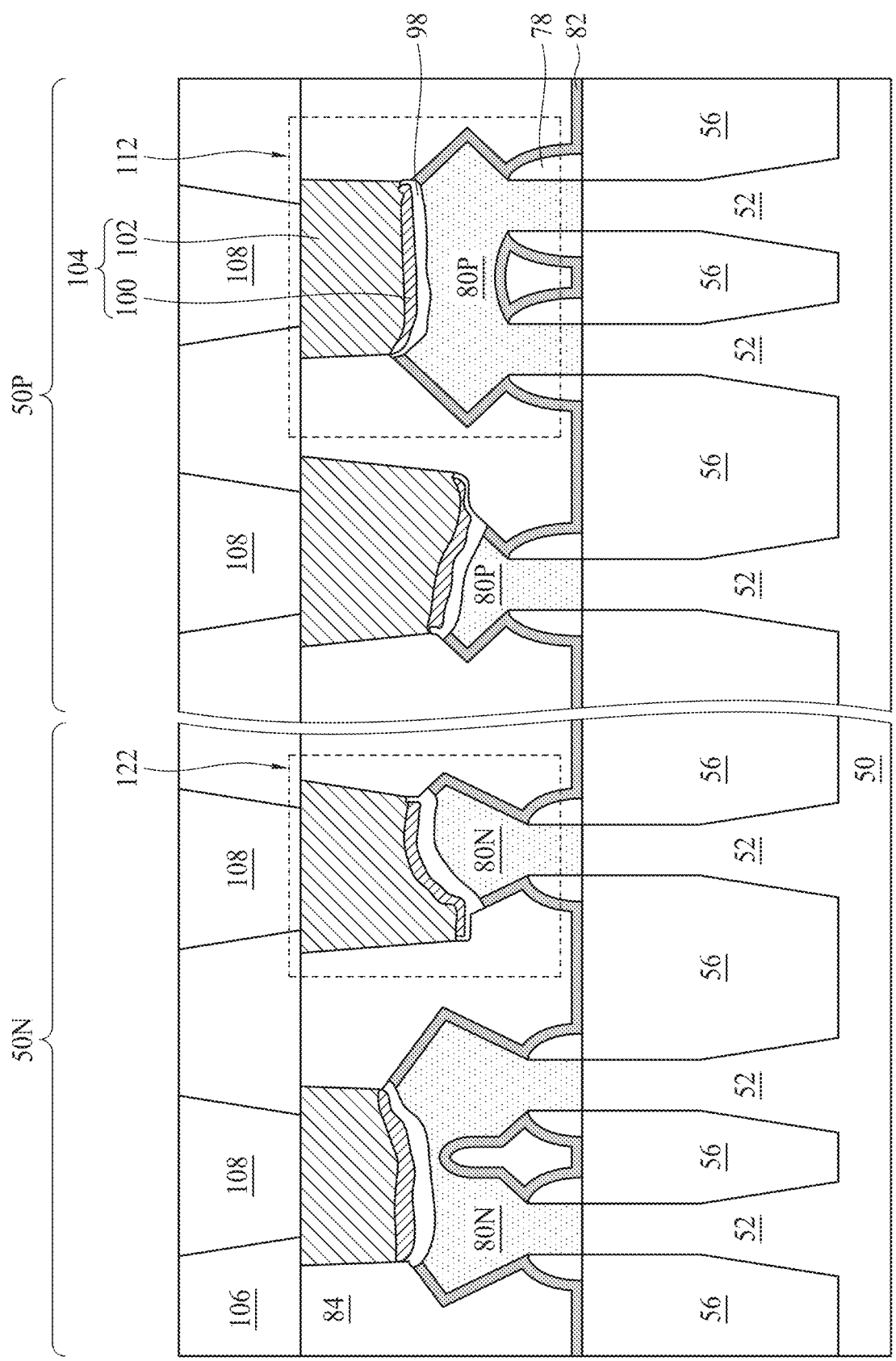

In FIGS. 16A, 16B and 16C, a second ILD 106 is formed over the first ILD 84. In some embodiments, the second ILD 106 may be formed using similar materials and methods as the first ILD 84 described above with reference to FIGS. 11A, 11B and 11C, and the description is not repeated herein. In some embodiments, the first ILD 84 and the second ILD 106 comprise a same material. In other embodiments, the first ILD 84 and the second ILD 106 comprise different materials.

After forming the second ILD 106, contact features 108 and 110 are formed in both the n-type region 50N and the p-type region 50P. The contact features 108 extend through the second ILD 106 and electrically couple to respective contact features 104. The contact features 110 extend through the second ILD 106 and respective gate masks 96, and electrically couple to respective gate stacks 92. The contact features 108 may be also referred to as source/drain vias. The contact features 110 may be also referred to as gate contacts, gate contact plugs, or gate vias.

Openings for the contact features 108 are formed in the second ILD 106 and expose respective contact features 104. Openings for the contact features 110 are formed in the second ILD 106 and respective gate masks 96, and expose respective gate stacks 92. The openings may be formed using acceptable photolithography and etch techniques. The etch may be anisotropic.

Figure 31:
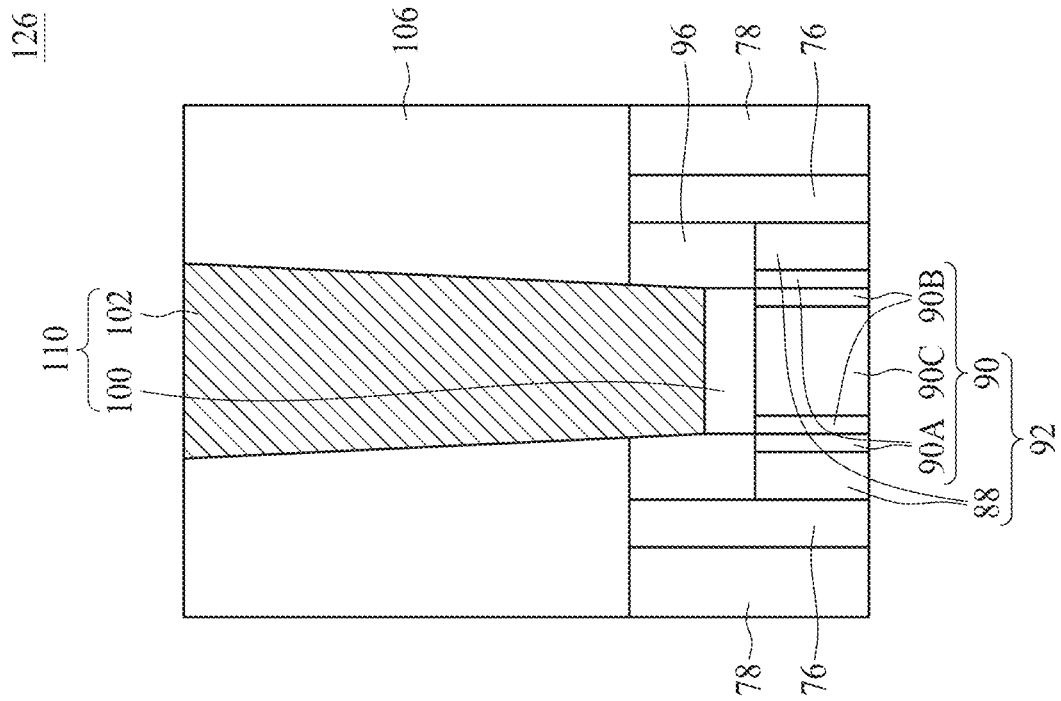
FIG. 31 is a cross-sectional view of a contact feature, in accordance with some embodiments.
Figure 30:
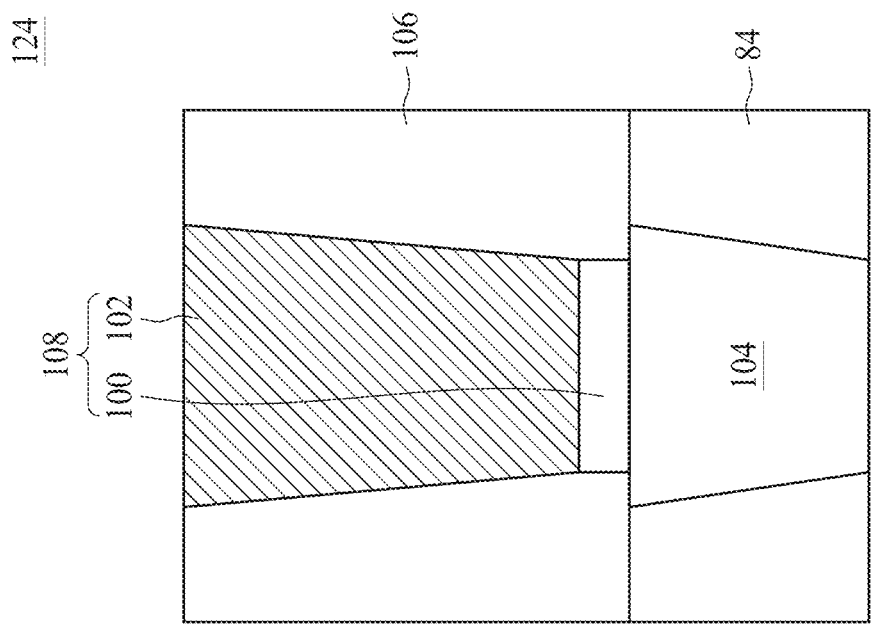
FIG. 30 is a cross-sectional view of a contact feature, in accordance with some embodiments.

After forming the openings, the contact features 108 and 110 are formed in respective openings. In some embodiments, the contact features 108 and 110 are formed by forming a liner (such as a seed layer, a diffusion barrier layer, an adhesion layer, or the like) and a conductive material in respective openings. The liner may include tungsten, cobalt, titanium, titanium nitride, tantalum, tantalum nitride, a combination thereof, or the like. The conductive material may include copper, a copper alloy, silver, gold, tungsten, cobalt, aluminum, nickel, a combination thereof, or the like. A planarization process, such as a CMP process, may be performed to remove excess material from a surface of the second ILD 106. The remaining portions of the liner and the conductive material form the contact features 108 and 110 in respective openings. After the planarization process, top surfaces of the contact features 108 and 110 are substantially level or coplanar with the top surface of the second ILD 106 within process variations of the planarization process. In other embodiments, the contact features 108 and 110 may be formed in a similar manner as the contact features 104 described above with reference to FIGS. 15A-15D. Such embodiments are illustrated in FIGS. 30 and 31, and are described below in greater detail. The contact features 108 and 110 may be formed in different processes, or may be formed in the same process. Although shown as being formed in the same cross-sections, it should be appreciated that each of the contact features 108 and 110 may be formed in different cross-sections, which may avoid shorting of the contacts.

FIGS. 17A-25A and 17B-25B are cross-sectional views of intermediate stages in the manufacturing of the contact feature 104 within a region 112 of FIG. 16C, in accordance with some embodiments. In particular, FIGS. 17A-25A and 17B-25B illustrate process steps performed in the region 112 of FIG. 16C. FIGS. 17A-25A are illustrated along the reference cross-section B-B illustrated in FIG. 1. FIGS. 17B-25B are illustrated along the reference cross-section C-C illustrated in FIG. 1. Process steps similar to process steps described below with reference to FIGS. 17A-25A and 17B-25B may be also applied to form other contact features 104 of the FinFET device illustrated in FIGS. 16A, 16B and 16C. Process steps similar to process steps described below with reference to FIGS. 17A-25A and 17B-25B may be also applied to form contact features 108 and 110 of the FinFET device illustrated in FIGS. 16A, 16B and 16C.

Figure 17B:
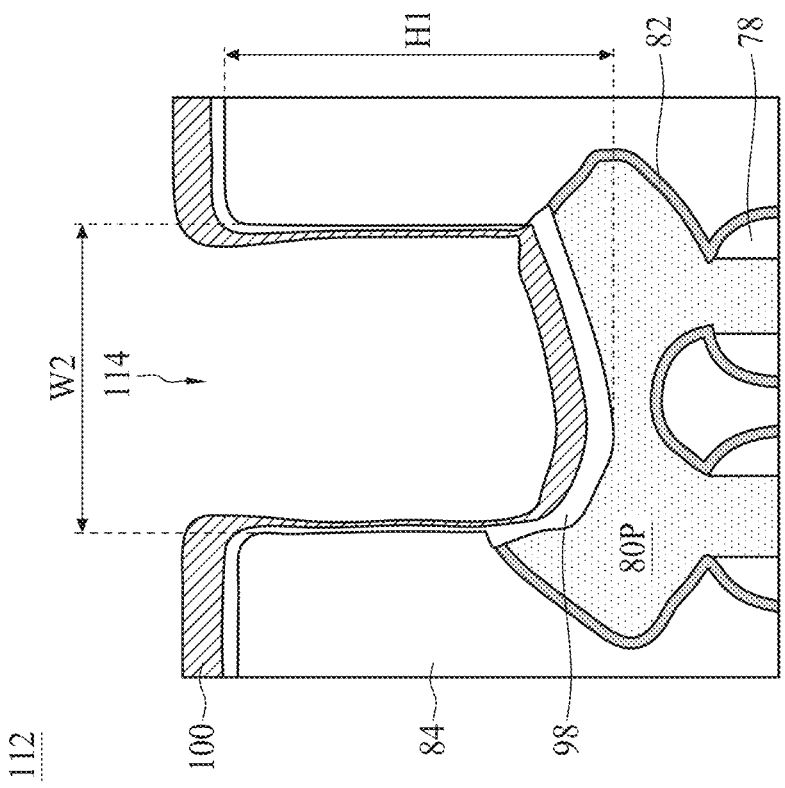
Figure 17A:
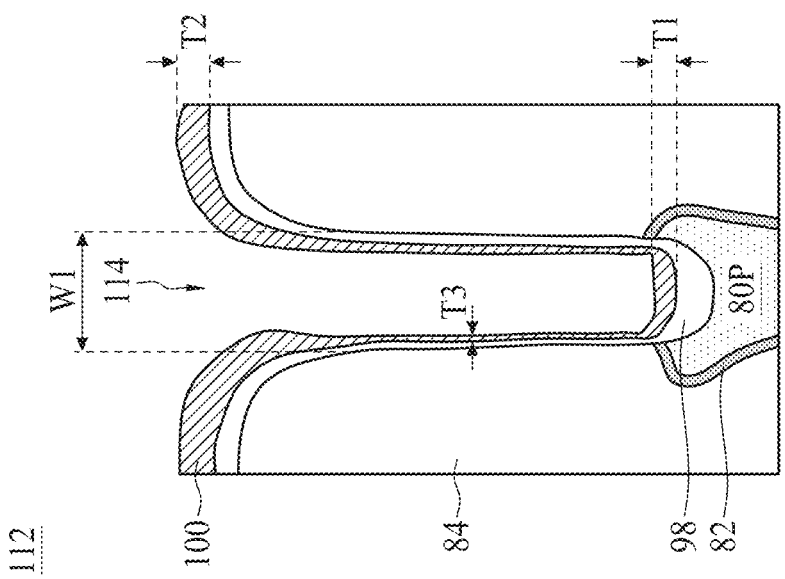

In FIGS. 17A and 17B, in some embodiments, after forming the gate masks 96 as described above with FIGS. 15A, 15B and 15C, an opening 114 is formed in the first ILD 84 and the CESL 82 to expose the epitaxial source/drain region 80P. In some embodiments, the opening 114 extends into the epitaxial source/drain region 80P. The opening 114 may be formed using suitable photolithography and etch techniques. The etch may be anisotropic. In some embodiments, the opening 114 has a height H1 between about 30 nm and 150 nm. In some embodiments, the opening 114 has a first width W1 (in the cross-section illustrated in FIG. 17A) between about 10 nm and about 40 nm. In some embodiments, the opening 114 has a second width W2 (in the cross-section illustrated in FIG. 17B) between about 10 nm and about 300 nm. In other embodiments, the second width W2 is between about 500 nm and about 1500 nm.

In some embodiments, a silicide layer 98 is formed over the epitaxial source/drain region 80P in the opening 114. Although the silicide layer 98 is referred to as a silicide layer, the silicide layer 98 may also be a germanide layer, or a silicon germanide layer (e.g., a layer comprising silicide and germanide). In some embodiments, a material of the silicide layer 98 is deposited on a bottom and sidewalls of the opening 114 using CVD, PECVD, or the like. In some embodiments when the silicide layer 98 comprises titanium silicide (TiSi), the silicide layer 98 may be formed by CVD using a titanium-containing precursor, such as $TiCl_4$, or the like. In some embodiments, the silicide region 98 has a thickness between about 3 nm and about 10 nm.

In other embodiments, the silicide layer 98 may be formed by depositing over the exposed portions of the epitaxial source/drain region 80P a metallic material (not shown) that is capable of reacting with the semiconductor materials of the underlying epitaxial source/drain region 80P (e.g., silicon, silicon germanium, germanium) to form silicide or germanide regions, followed by an annealing process to form the silicide layer 98. The metallic material may be deposited on the bottom and the sidewalls of the opening 114. The metallic material may comprise Ti, Co, Ni, NiCo, Pt, NiPt, Ir, PtIr, Er, Yb, Pd, Rh, Nb, a combination thereof, or the like, and may be formed using PVD, sputtering, a combination thereof, or the like. Subsequently, the annealing process is performed to form the silicide layer 98. In some embodiments, the annealing process causes the metallic material to react with the semiconductor material of the epitaxial source/drain region 80P and form the silicide layer 98. After forming the silicide layer 98, unreacted portions of the metallic material are removed using a suitable removal process, such as a suitable etch process, for example. In such embodiments, the silicide layer 98 extends along the bottom of the opening 114 and does not extend along the sidewalls of the opening 114.

After forming the silicide layer 98, a conductive liner 100 is formed on the silicide layer 98 along the sidewalls and the bottom of the opening 114, and over the first ILD 84. In some embodiments, the conductive liner 100 may comprise a metallic material, such as tungsten (W), cobalt (Co), a combination thereof, or the like, and may be formed by sputtering, PVD, ALD, CVD, or the like. In some embodiments, the conductive liner 100 is deposited in a non-conformal manner, such that a first thickness T1 of a first portion of the conductive liner 100 over the bottom of the opening 114 and a second thickness T2 of a second portion of the conductive liner 100 over the first ILD 84 are greater than a third thickness T3 of a third portion of the conductive liner 100 on the sidewalls of the opening 114. In some embodiments, the first thickness T1 is between about 3 nm and about 10 nm. In some embodiments, the second thickness T2 is between about 3 nm and about 10 nm. In some embodiments, the third thickness T3 is between about 1 nm and about 3 nm.

Figure 18B:
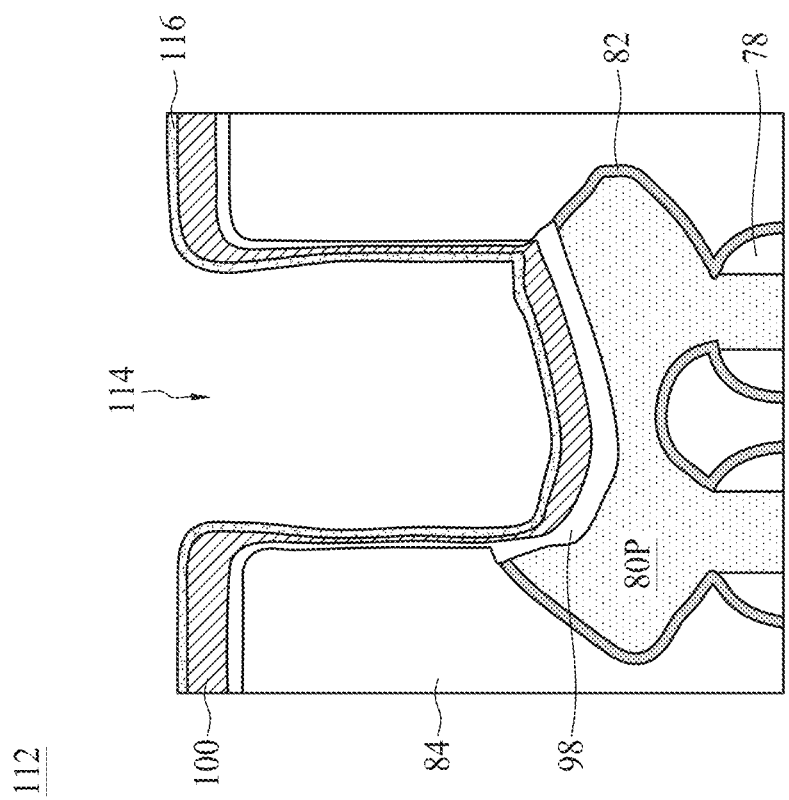
Figure 18A:
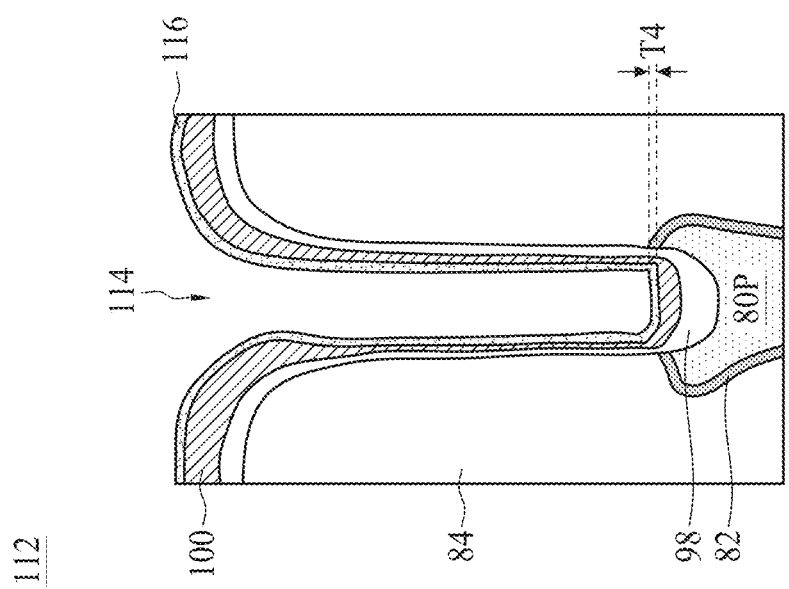

In FIGS. 18A and 18B, a surface modification process is performed on an exposed surface of the conductive liner 100 to form a surface coating layer 116 over the conductive liner 100. In some embodiments, the surface modification process comprises a plasma process, a thermal soaking process, or the like. In such embodiments, the surface modification process transforms a material of an upper layer of the conductive liner 100 into a modified material. A treatment depth of the surface modification process may be between about 5 Å and 30 Å. In some embodiments, the treatment depth may be between about 10% and about 50% of the thickness of the conductive liner 100. In such embodiments, the surface coating layer 116 may have a thickness T4 between about 5 Å and 40 Å.

In some embodiments when surface modification process comprises a plasma process, the plasma process may be performed using a plasma generated from a process gas comprising a reaction gas and a carrier gas. The reaction gas may comprise $NH_3$, $N_2$, $H_2$, a mixture thereof, or the like. The carrier gas may comprise an inert chemical, such as Ar, $N_2$, He, a mixture thereof, or the like. In some embodiments, the plasma process may be an in-situ plasma process, such as a capacitively coupled plasma (CCP) process, or the like. In other embodiments, the plasma process may be a remote plasma process, such as an inductively coupled plasma (ICP) process, or the like. A flow rate of the reaction gas may be between 50 sccm to 1000 sccm. The plasma process may be performed at a plasma power between about 100 W and about 5000 W. The plasma process may be performed at a process pressure between about 500 mTorr and about 30000 mTorr. The plasma process may be performed at a process temperature between about 150° C. and about 500° C. In some embodiments when the conductive liner 100 comprises a metallic material and the reaction gas of the plasma process comprises a nitrogen-containing chemical, the surface coating layer 116 comprises a nitrogen-containing metallic material or a nitride of the metallic material. For example, when the metallic material is tungsten, the surface coating layer 116 comprises nitrogen-containing tungsten or tungsten nitride. For example, when the metallic material is cobalt, the surface coating layer 116 comprises nitrogen-containing cobalt or cobalt nitride.

In some embodiments when surface modification process comprises a thermal soaking process, the thermal soaking process may be performed using a process gas comprising a reaction gas and a carrier gas. The reaction gas may comprise a titanium-containing chemical, a tantalum-containing chemical, a silicon-containing chemical, or the like. The titanium-containing chemical may comprise $TiCl_4$, tetrakis(dimethylamino)titanium (TDMAT), $TiI_4$, a mixture thereof, or the like. The tantalum-containing chemical may comprise tris(ethylmethylamido)(tert-butylimido)tantalum (TBTEMT), pentakis(dimethylamino)tantalum (PDMAT), a mixture thereof, or the like. The silicon-containing chemical may comprise $SiH_4$, $SiCl_4$, $SiI_4$, $SiH_2Cl_2$, $SiF_4$, mixture thereof, or the like. The carrier gas may comprise an inert chemical, such as Ar, $N_2$, He, a mixture thereof, or the like. A flow rate of the reaction gas may be between 50 sccm to 1000 sccm. The thermal soaking process may be performed at a process pressure between about 500 mTorr and about 30000 mTorr. The thermal soaking process may be performed at a process temperature between about 150° C. and about 500° C. In some embodiments when the conductive liner 100 comprises a metallic material and the reaction gas of the thermal soaking process comprises titanium-containing chemical, the surface coating layer 116 comprises a titanium-containing metallic material. In some embodiments when the conductive liner 100 comprises a metallic material and the reaction gas of the thermal soaking process comprises tantalum-containing chemical, the surface coating layer 116 comprises a tantalum-containing metallic material. In some embodiments when the conductive liner 100 comprises a metallic material and the reaction gas of the thermal soaking process comprises silicon-containing chemical, the surface coating layer 116 comprises a silicon-containing metallic material. In some embodiments when the metallic material is tungsten, the surface coating layer 116 may comprise titanium-containing tungsten, tantalum-containing tungsten, or silicon-containing tungsten. In some embodiments when the metallic material is cobalt, the surface coating layer 116 may comprise titanium-containing cobalt, tantalum-containing cobalt, or silicon-containing cobalt.

In some embodiments, the surface modification process comprises a deposition process that deposits a desired material over the conductive liner 100 to form the surface coating layer 116. In some embodiments, the surface coating layer 116 may comprise a metallic material (such as titanium, tantalum, aluminum, cobalt, tungsten, or the like), a nitrogen-containing metallic material or a metal nitride material (such as titanium nitride, tantalum nitride, or the like), or the like. In some embodiments when the surface coating layer 116 comprises a metallic material, the surface coating layer 116 may be deposited using sputtering, PVD, a plasma-assisted thermal deposition process (such as PEALD, PECVD, or the like), or the like. In some embodiments when the surface coating layer 116 comprises a nitrogen-containing metallic material or a metal nitride material, the surface coating layer 116 may be deposited using a plasma-assisted thermal deposition process, such as PEALD, PECVD, or the like.

In some embodiments, the plasma-assisted thermal deposition process may be performed using a plasma generated from a process gas comprising a reaction gas and a carrier gas. The carrier gas may comprise an inert chemical, such as Ar, $N_2$, He, a mixture thereof, or the like. In some embodiments when the surface coating layer 116 comprises a metallic material, the reaction gas comprises a metal-containing chemical, such as a titanium-containing chemical, a tantalum-containing chemical, a cobalt-containing chemical, an aluminum-containing chemical, or the like. The titanium-containing chemical may comprise $TiCl_4$, TDMAT, $TiI_4$, a mixture thereof, or the like. The tantalum-containing chemical may comprise TBTEMT, PDMAT, a mixture thereof, or the like. The cobalt-containing chemical may comprise (3,3-Dimethyl-1-butyne)dicobalt hexacarbonyl (CCTBA), or the like. The aluminum-containing chemical may comprise $AlO_x$, or the like. In some embodiments when the surface coating layer 116 comprises a nitrogen-containing metallic material or a metal nitride material, the reaction gas further comprises a nitrogen-containing chemical in addition to the metal-containing chemical described above. The nitrogen-containing chemical may comprise $NH_3$, $N_2$, a mixture thereof, or the like.

In some embodiments, the plasma-assisted thermal deposition process may be an in-situ plasma process, such as a CCP process, or the like. In other embodiments, the plasma-assisted thermal deposition process may be a remote plasma process, such as an ICP process, or the like. A flow rate of the reaction gas may be between 50 sccm to 1000 sccm. The plasma-assisted thermal deposition process may be performed at a plasma power between about 100 W and about 5000 W. The plasma-assisted thermal deposition process may be performed at a process pressure between about 500 mTorr and about 30000 mTorr. The plasma-assisted thermal deposition process may be performed at a process temperature between about room temperature and about 500° C.

Figure 19B:
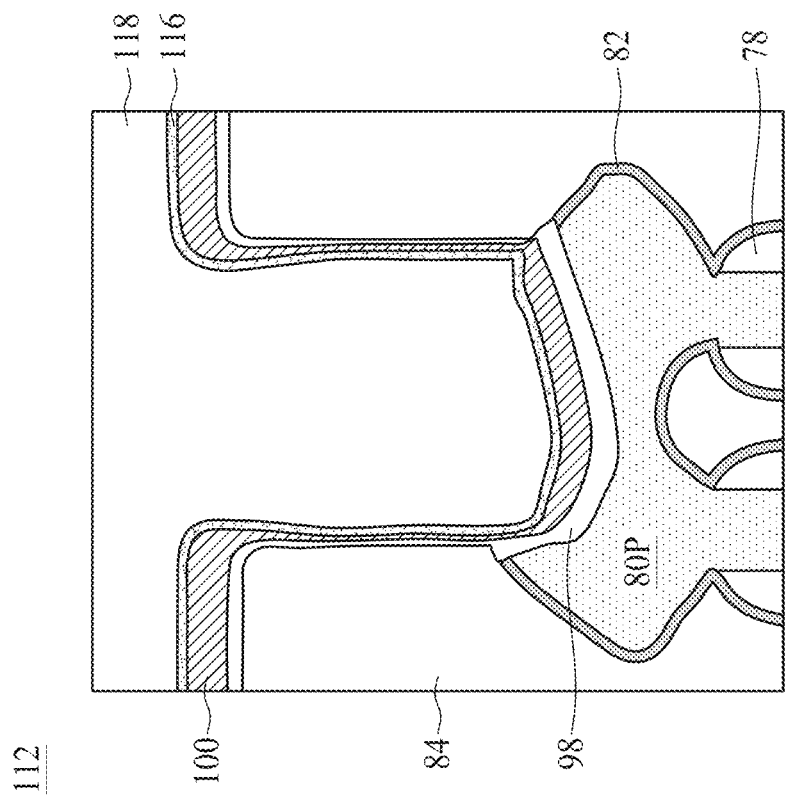
Figure 19A:
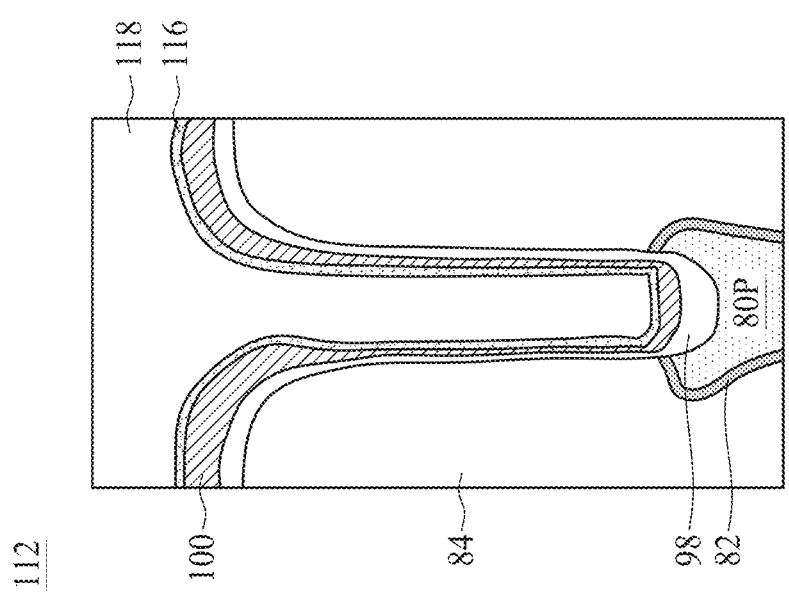

In FIGS. 19A and 19B, a bottom anti-reflective coating (BARC) layer 118 is deposited in the opening 114 (see FIGS. 18A and 18B) and over the first ILD 84. The BARC layer 118 fills the opening 114. In some embodiments, the surface coating layer 116 may promote a cross-linking reaction of the BARC layer 118 and may reduce or avoid the formation of pores or voids within the BARC layer 118. By reducing or avoiding the formation of pores or voids within the BARC layer 118, filling of the opening 114 with the BARC layer 118 is improved. The BARC layer 118 may comprise a polymer material and may be formed using coating followed by a post anneal.

Figure 20B:
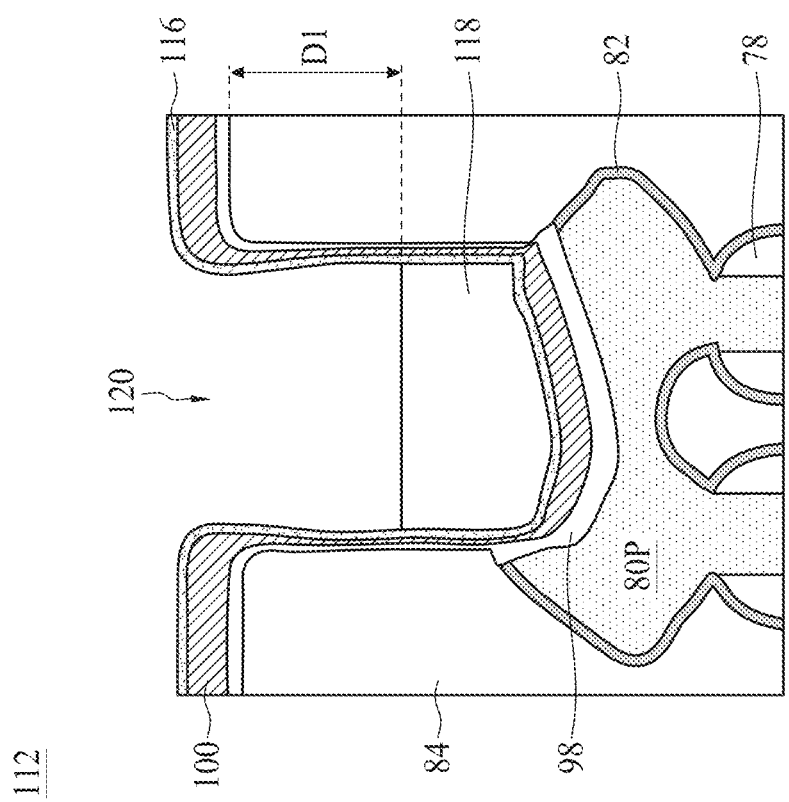
Figure 20A:
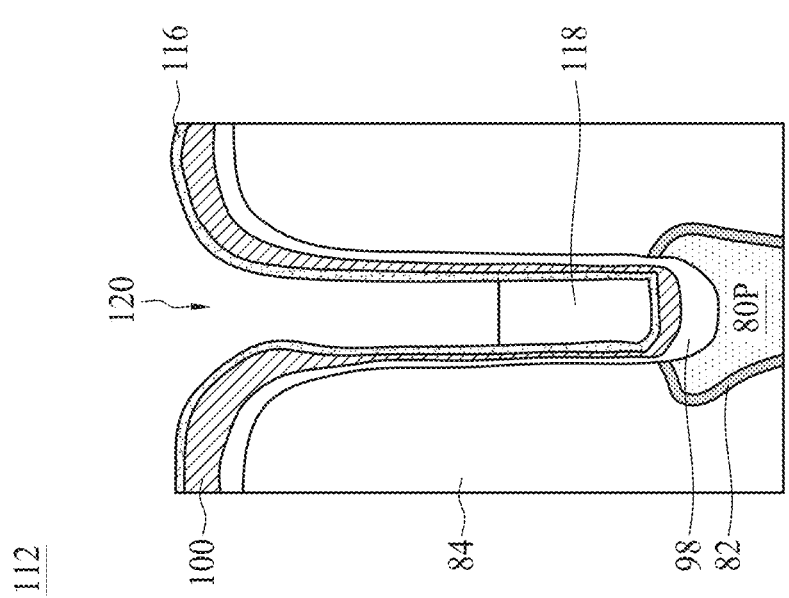

In FIGS. 20A and 20B, the BARC layer 118 is recessed below the top surface of the first ILD 84 to form a recess 120. A remaining portion of the BARC layer 118 protects portions of the surface coating layer 116, the conductive liner 100, and the silicide layer 98 that are covered by the remaining portion of the BARC layer 118. In some embodiments, the recessing processes comprises an etch process that is selective to a material of the BARC layer 118. The etch process may be a dry etch process or a wet etch process. The recessing process exposes an upper portion of the surface coating layer 116. The BARC layer 118 is recessed below the top surface of the first ILD 84 to a depth D1. In some embodiments, the depth D1 may be between about 20 nm and about 50 nm.

In FIGS. 21A and 21B, exposed portions of the surface coating layer 116, and portions of the conductive liner 100 and the silicide layer 98 that are interposed between the exposed portions of the surface coating layer 116 and the first ILD 84 are removed to expose the first ILD 84. The removal process may be also referred to as a top pull-back process. In some embodiments, the removal process may comprise one or more suitable wet etch processes that selectively etch material of the surface coating layer 116, the conductive liner 100 and the silicide layer 98 without significantly etching the BARC layer 118 and the first ILD 84. The wet etch processes may be performed using etchants such as HCl, ozone-deionized (DIO$_3$) water, or the like. In some embodiments, the removal process may comprise a first wet etch process that is selective to a material of the surface coating layer 116, followed by a second wet etch process that is selective to a material of the conductive liner 100, and followed by a third wet etch process that is selective to a material of the silicide layer 98.

By improving the filling of the opening 114 (see FIGS. 18A and 18B) with the BARC layer 118 and reducing or avoiding the formation of pores and voids in the BARC layer 118 as described above with reference to FIGS. 19A and 19B, amount of etchants of the top pull-back process that may reach underlying layers (such the conductive liner 100, the silicide layer 98, the epitaxial source/drain region 80P) is reduced or eliminated. Accordingly, the damage to the underlying layers during the top pull-back process is reduced or avoided. In some embodiments, a thickens loss of the conductive liner 100 due to the top pull-back process is less than about 10 Å.

In FIGS. 22A and 22B, the remaining portion of the BARC layer 118 (see FIGS. 21A and 21B) is removed to extend the recess 120 toward the epitaxial source/drain region 80P. In some embodiments when the BARC layer 118 comprises a polymer material, the removal process may comprise an acceptable ashing process followed by a wet clean process. After the removal process, a remaining portion of the surface coating layer 116 is exposed in the recess 120.

Figure 23B:
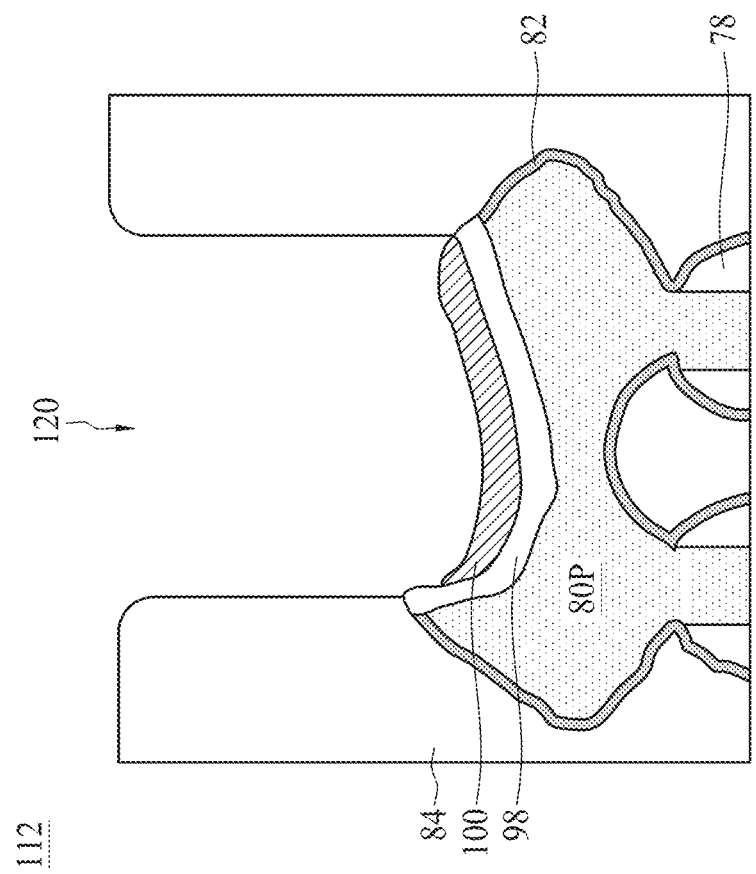
Figure 23A:
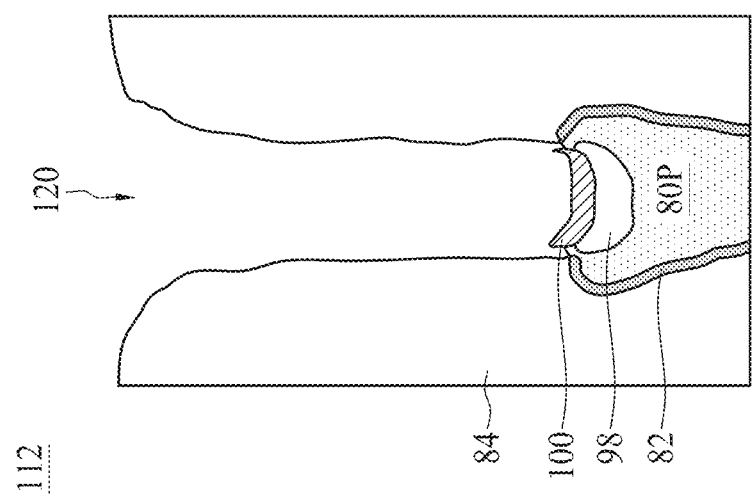

In FIGS. 23A and 23B, the remaining portion of the surface coating layer 116 (see FIGS. 22A and 22B), and portions of the conductive liner 100 and the silicide layer 98 disposed on the sidewalls of the first ILD 84 are removed to expose the sidewalls of the first ILD 84 and further extend the recess 120 toward to the epitaxial source/drain region 80P. The removal process may be also referred to as a pull-back process. In some embodiments, the removal process may comprise one or more suitable wet etch processes that selectively etch materials of the surface coating layer 116, the conductive liner 100 and the silicide layer 98 without significantly etching the first ILD 84. The wet etch processes may be performed using etchants such as NH$_4$OH, HCl, DIO$_3$ water, or the like. In some embodiments, the removal process may comprise a first wet etch process that is selective to a material of the surface coating layer 116, followed by a second wet etch process that is selective to a material of the conductive liner 100, and followed by a third wet etch process that is selective to a material of the silicide layer 98.

Figure 24B:
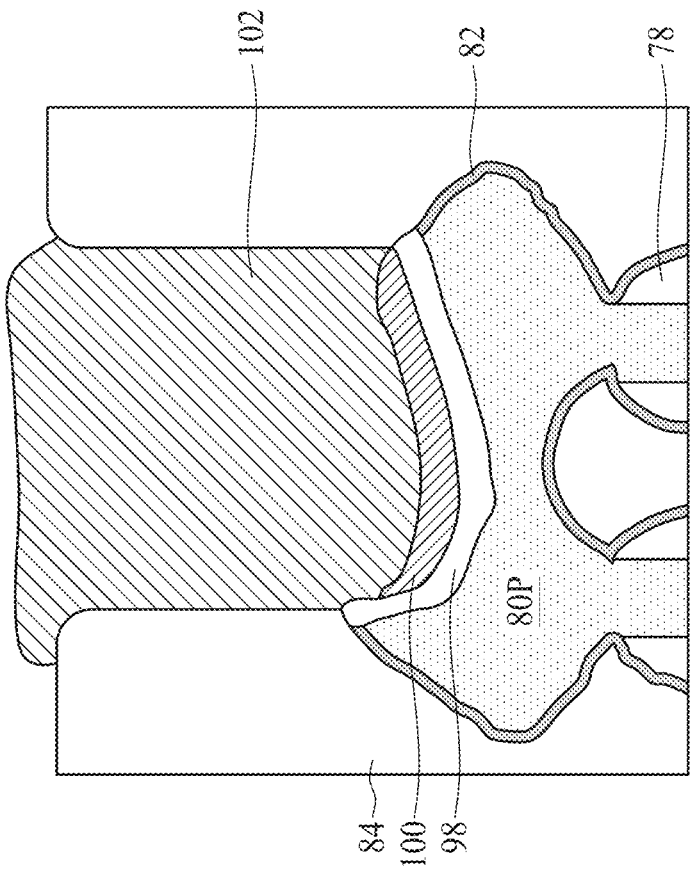
Figure 24A:
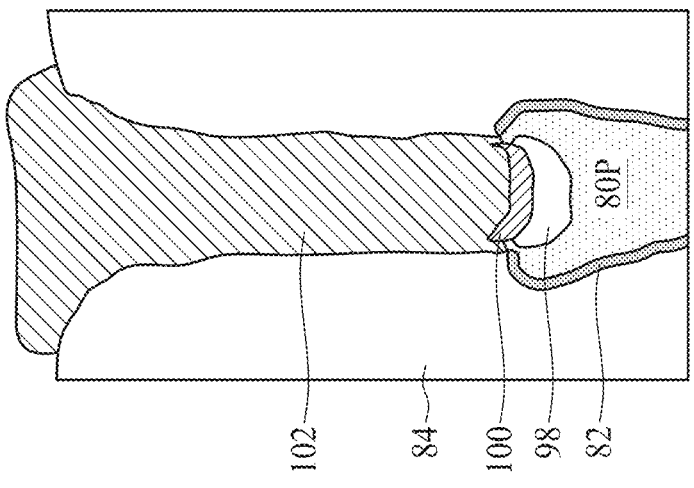

In FIGS. 24A and 24B, the recess 120 (see FIGS. 23A and 23B) is filled with a conductive fill material 102. In some embodiments, the conductive fill material 102 may comprise copper, a copper alloy, silver, gold, tungsten, cobalt, aluminum, nickel, an alloy thereof, a combination thereof, or the like, and may be formed using a deposition process such as ALD, CVD, PECVD, or the like. In some embodiments, a rate of deposition of the conductive fill material 102 on the material of the conductive liner 100 is greater than a rate of deposition of the conductive fill material 102 on the material of the first ILD 84. In some embodiments, the rate of deposition of the conductive fill material 102 on the material of the first ILD 84 is suppressed or inhibited. In such embodiments, the deposition process for forming the conductive fill material 102 is a deposition process that selectively deposits the conductive fill material 102 on the conductive liner 100 and fills the recess 120 (see FIGS. 23A and 23B) in a bottom-up manner. By reducing or avoiding the damage to the conductive liner 100 as described above with reference to FIGS. 21A and 21B, the conductive liner 100 may maintain a uniform thickness or may have reduced thickness variation, which may assist with the bottom-up filling of the recess 120 with the conductive fill material 102. By filling the recess 120 in a bottom-up manner, formation of seams or voids in the conductive fill material 102 is reduced or avoided. Accordingly, a resistance of the resulting contact feature 104 (see FIGS. 25A and 25B) is reduced.

Figure 25B:
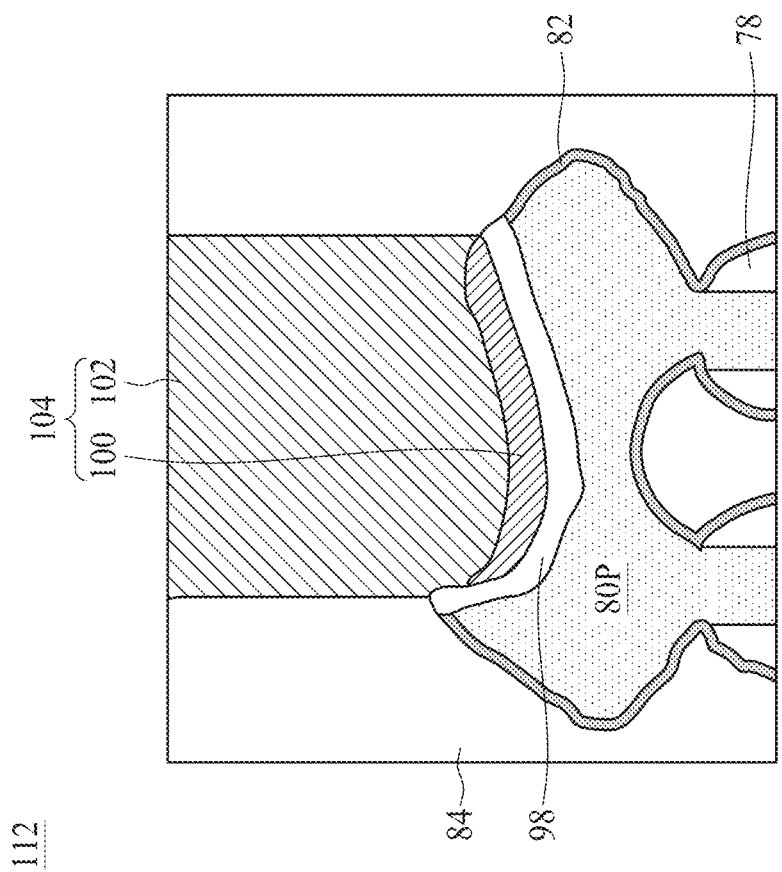
Figure 25A:
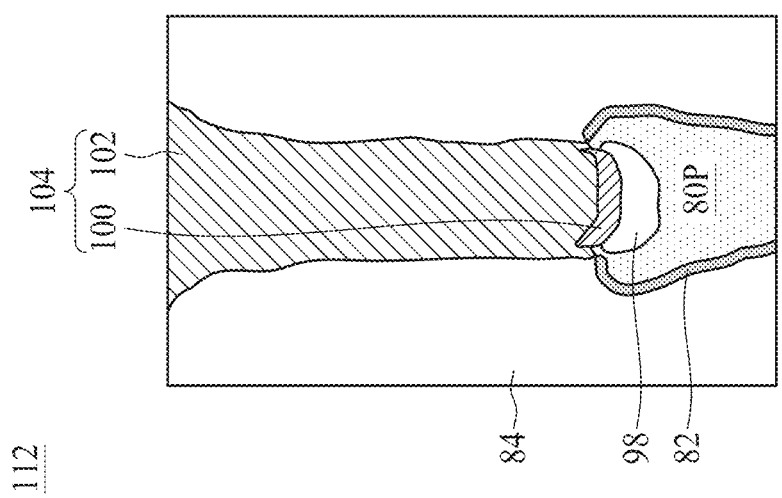

In FIGS. 25A and 25B, a planarization process is performed to remove portions of the conductive fill material 102 that extend above the top surface of the first ILD 84. The planarization process may comprise a CMP process, an etch process, a combination thereof, or the like. After performing the planarization process, a top surface of the conductive fill material 102 is substantially level or coplanar with the top surface of the first ILD 84 within process variations of the planarization process. Portions of the conductive liner 100 and the conductive fill material 102 remaining in the recess 120 (see FIGS. 23A and 23B) form the contact feature 104. In some embodiments, a portion of the conductive fill material 102 extends below a topmost portion of the epitaxial source/drain region 80P.

Figure 26:
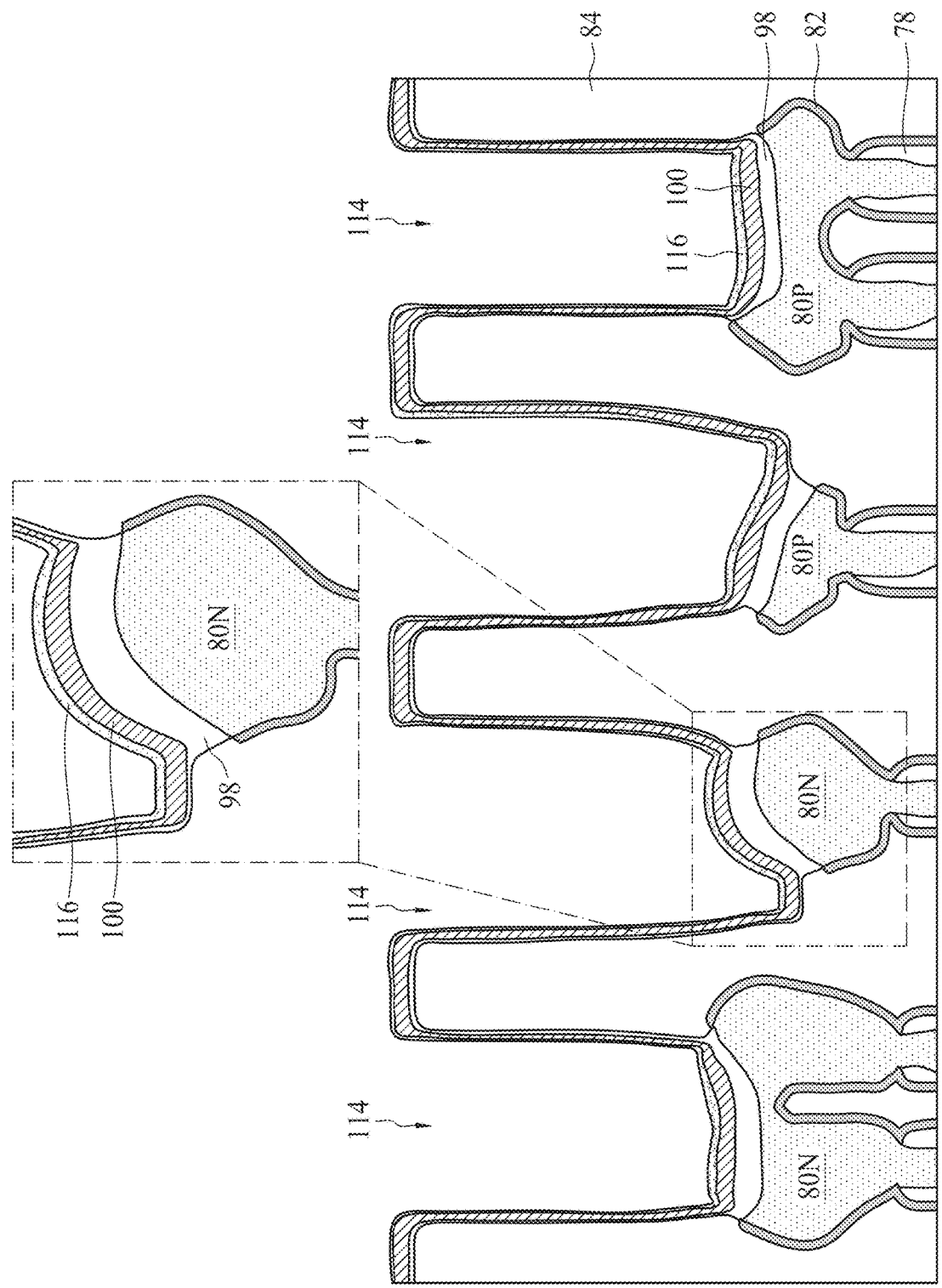
FIG. 26 is a cross-sectional view of an intermediate stage in the manufacturing of contact features, in accordance with some embodiments.

Process steps similar to process steps described above with reference to FIGS. 17A-25A and 17B-25B may be also applied to form other contact features 104 of the FinFET device illustrated in FIGS. 16A, 16B and 16C. Such an embodiment is illustrated in FIG. 26, which shows a cross-sectional view of an intermediate stage in the manufacturing of contact features 104, in accordance with some embodiments. FIG. 26 is illustrated along the reference cross-section C-C illustrated in FIG. 1.

In FIG. 26, in some embodiments, after forming the gate masks 96 as described above with FIGS. 15A, 15B and 15C, openings 114 are formed in the first ILD 84 and the CESL 82 to expose respective ones of the epitaxial source/drain regions 80N and 80P. In some embodiments, the openings 114 may be formed as described above with reference to FIGS. 17A and 17B, and the description is not repeated herein. After forming the openings 114, the silicide layer 98 and the conductive liner 100 are formed on sidewalls and bottoms of the openings 114 and over the first ILD 84 as described above with reference to FIGS. 17A and 17B, and the description is not repeated herein. After forming the conductive liner 100, the surface coating layer 116 is formed over the conductive liner 100 as described above with reference to FIGS. 18A and 18B, and the description is not repeated herein. Subsequently, process steps described above with reference to FIGS. 19A-25A and 19B-25B are performed on the structure of FIG. 26, thereby forming the contact features 104 as illustrated in FIG. 15C.

Figure 27:
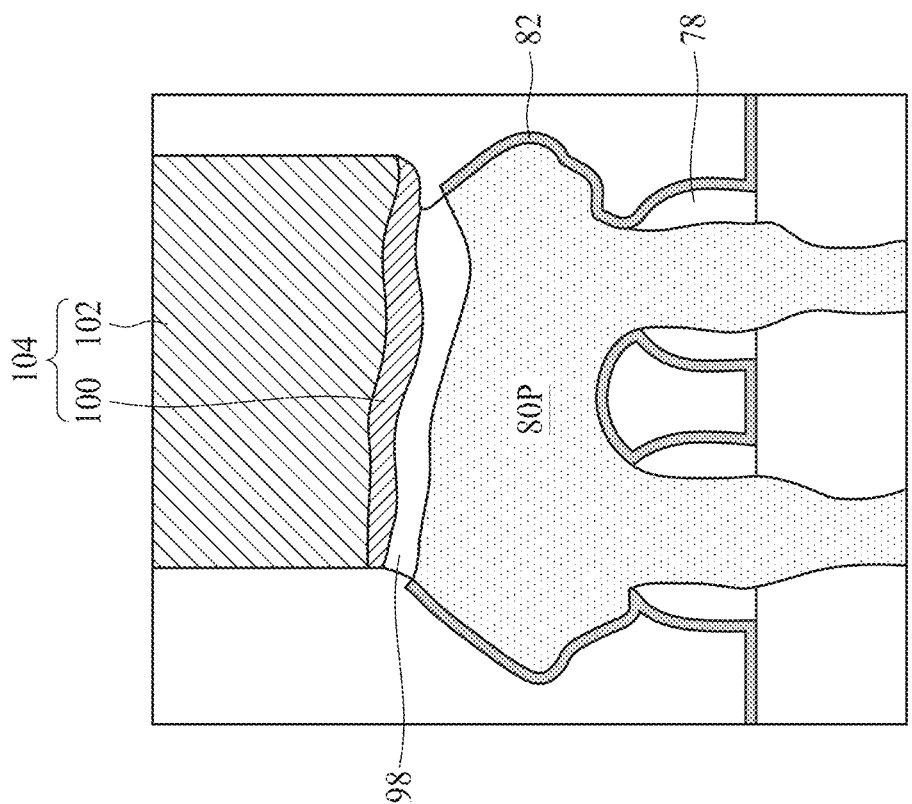
FIG. 27 is a cross-sectional view of a contact feature, in accordance with some embodiments.

FIG. 27 is a cross-sectional view of a contact feature 104 and a respective epitaxial source/drain region 80P, in accordance with some embodiments. FIG. 27 is illustrated along the reference cross-section C-C illustrated in FIG. 1. The structure of FIG. 27 is similar to the structure of FIG. 25B, with similar features being labeled by similar numerical references, and descriptions of the similar features are not repeated herein. In some embodiments, the contact feature 104 may be formed as described above with reference to FIGS. 17A-25A and 17B-25B, and the description is not repeated herein. The structure of FIG. 27 differs from the structure of FIG. 25B by shapes of the silicide layer 98, the conductive liner 100, and the conductive fill material 102.

Figure 28:
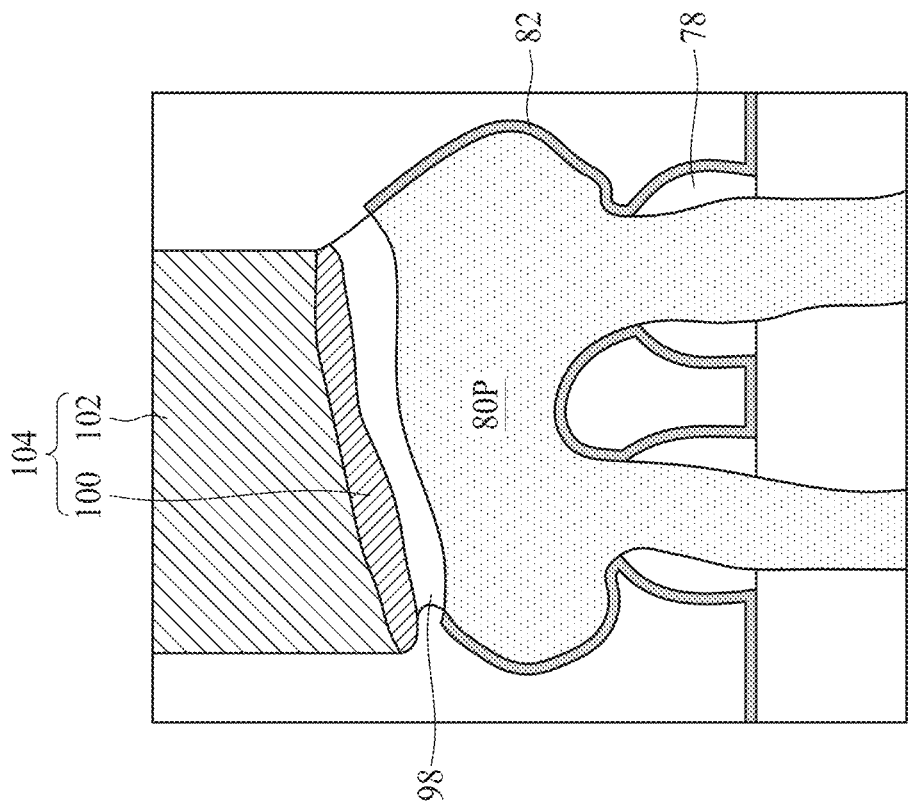
FIG. 28 is a cross-sectional view of a contact feature, in accordance with some embodiments.

FIG. 28 is a cross-sectional view of a contact feature 104 and a respective epitaxial source/drain region 80P, in accordance with some embodiments. FIG. 28 is illustrated along the reference cross-section C-C illustrated in FIG. 1. The structure of FIG. 28 is similar to the structure of FIG. 25B, with similar features being labeled by similar numerical references, and descriptions of the similar features are not repeated herein. In some embodiments, the contact feature 104 may be formed as described above with reference to FIGS. 17A-25A and 17B-25B, and the description is not repeated herein. The structure of FIG. 28 differs from the structure of FIG. 25B by shapes of the silicide layer 98, the conductive liner 100, and the conductive fill material 102.

Figure 29:
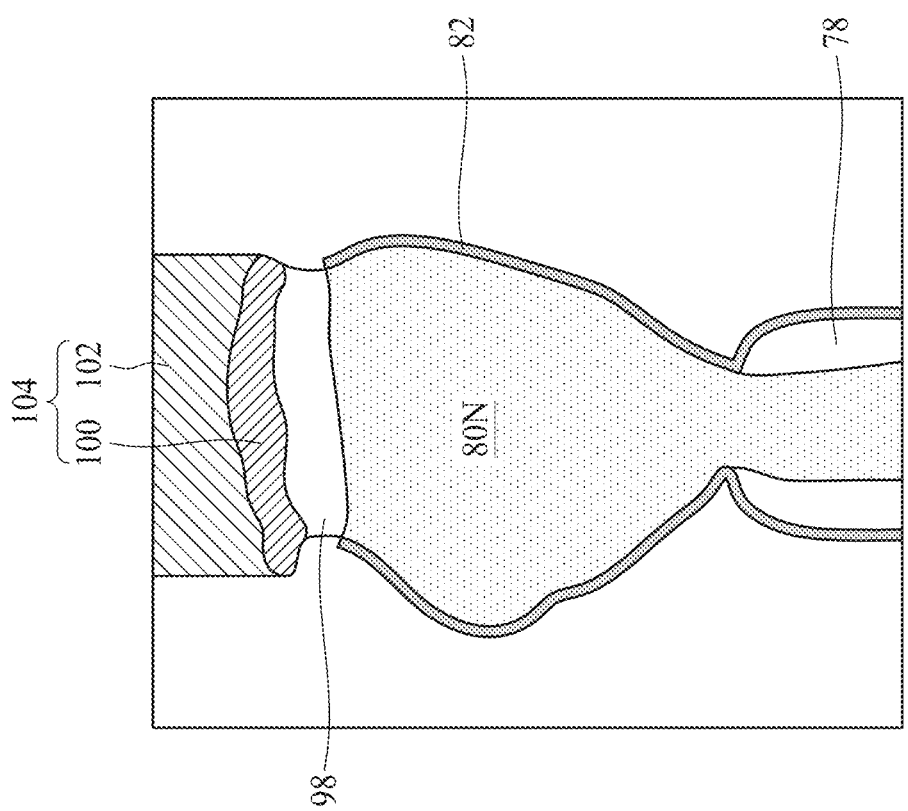
FIG. 29 is a cross-sectional view of a contact feature, in accordance with some embodiments.

FIG. 29 is a cross-sectional view of a contact feature 104 and a respective epitaxial source/drain region 80N, in accordance with some embodiments. FIG. 29 is illustrated along the reference cross-section C-C illustrated in FIG. 1. The structure of FIG. 29 is similar to a structure of a region 122 of FIG. 16C, with similar features being labeled by similar numerical references, and descriptions of the similar features are not repeated herein. In some embodiments, the contact feature 104 may be formed as described above with reference to FIGS. 17A-25A and 17B-25B, and the description is not repeated herein. The structure of FIG. 29 differs from the structure of the region 122 of FIG. 16C by shapes of the silicide layer 98, the conductive liner 100, and the conductive fill material 102.

FIG. 30 is a cross-sectional view of a contact feature 108, in accordance with some embodiments. In particular, FIG. 30 illustrates a detailed view of a region 124 of FIG. 16B. In the illustrated embodiments, the contact feature 108 comprises a conductive liner 100 and a conductive fill material 102 over the conductive liner 100. In some embodiments, the contact feature 108 (including the conductive liner 100 and the conductive fill material 102) may be formed using process steps that are similar to the process steps described above with reference to FIGS. 17A-25A and 17B-25B, and the description is not repeated herein.

FIG. 31 is a cross-sectional view of a contact feature 110, in accordance with some embodiments. In particular, FIG. 31 illustrates a detailed view of a region 126 of FIG. 16B. In the illustrated embodiments, the contact feature 110 comprises a conductive liner 100 and a conductive fill material 102 over the conductive liner 100. In some embodiments, the contact feature 110 (including the conductive liner 100 and the conductive fill material 102) may be formed using process steps that are similar to the process steps described above with reference to FIGS. 17A-25A and 17B-25B, and the description is not repeated herein.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety. Such an NSFET embodiment is illustrated in FIGS. 32A and 32B below.

Figures 32A, 32B:
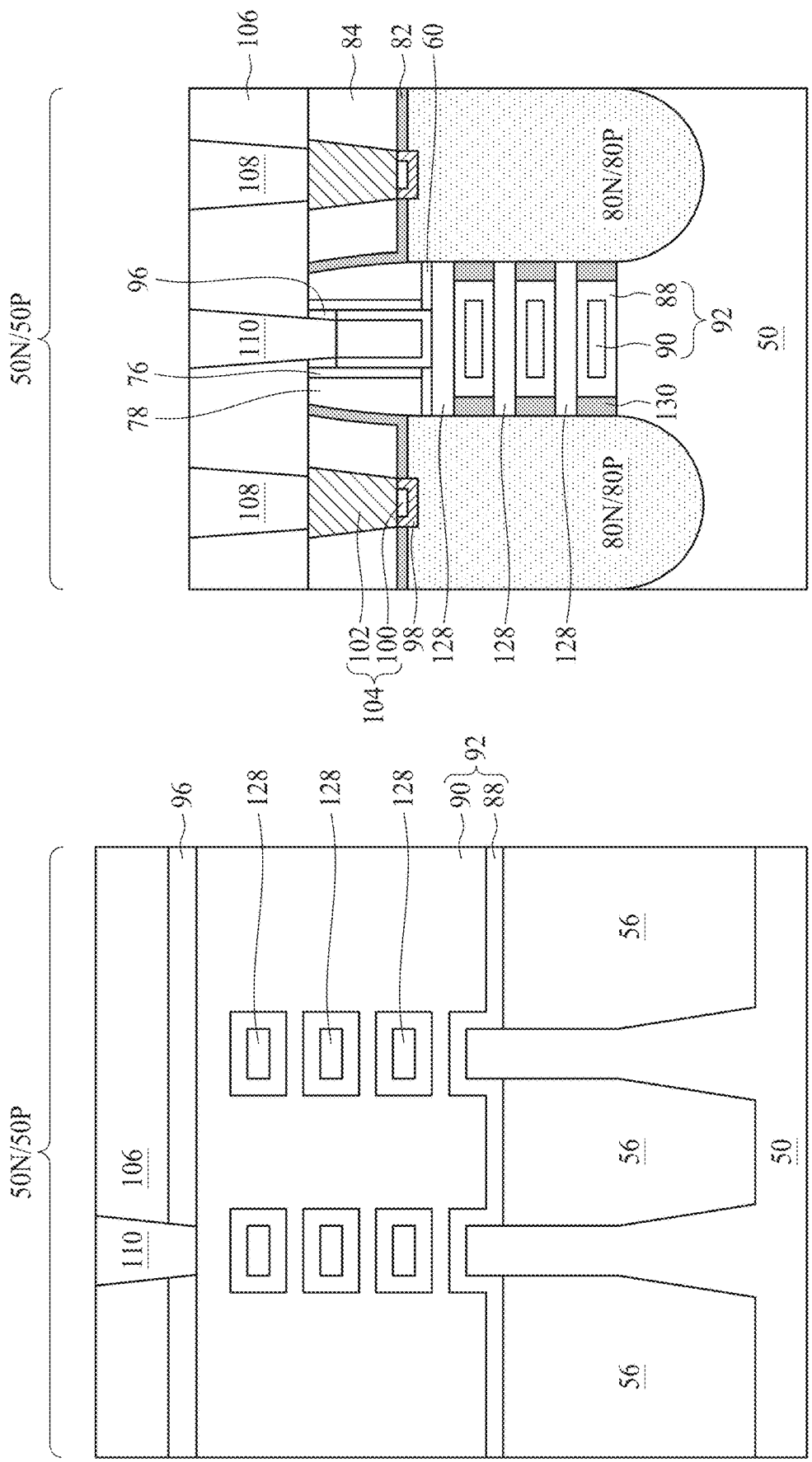
FIGS. 32A and 32B are cross-sectional views of an NSFET device, in accordance with some embodiments.

FIGS. 32A and 32B are cross-sectional views of an NSFET device, in accordance with some embodiments. FIG. 32A illustrates a cross-sectional view along the reference cross-section A-A illustrated in FIG. 1. FIG. 32B illustrates a cross-sectional view along the reference cross-section B-B illustrated in FIG. 1. The structure illustrated in FIGS. 32A and 32B is similar to the structure illustrated in FIGS. 16A and 16B, with like features being labeled by like numerical references, and descriptions of the like features are not repeated herein. Instead of the fins 52 (see FIGS. 16A and 16B), the structure illustrated in FIGS. 32A and 32B comprises nanostructures 128, such that portions of the gate stacks 92 wrap around the nanostructures 128. In some embodiments, the portions of the gate stacks 92 that wrap around the nanostructures 128 are isolated from adjacent epitaxial source/drain regions 80N/80P by spacers 130. In some embodiments, the nanostructures 128 may be formed using similar materials as the substrate 50 and the description is not repeated herein. In some embodiments, the nanostructures 128 and the substrate 50 comprise a same material. In other embodiments, the nanostructures 128 and the substrate 50 comprise different materials. The spacers 130 may comprise a material such as silicon nitride or silicon oxynitride, although any suitable material, such as low-dielectric constant (low-k) materials having a k-value less than about 3.5, may be utilized.

Embodiments may achieve advantages. The surface coating layer 116 formed over the conductive liner 100 (see FIGS. 18A and 18B) may promote a cross-linking reaction of the BARC layer 118 (see FIGS. 19A and 19B) and improve filling of the contact opening 114 (see FIGS. 18A and 18B) with the BARC layer 118, so that damage to underlying layers (such as, for example, the conductive liner 100, the silicide layer 98, and portions of an epitaxial source/drain region 80P illustrated in FIGS. 21A and 21B) during a top pull-back process (see FIGS. 21A and 21B) for removing top portions of the conductive liner 100 is reduced or avoided. By avoiding the damage to the conductive liner 100, the conductive liner 100 may maintain a uniform thickness or may have reduced thickness variation, which may assist with the bottom-up filling of the recess 120 (see FIGS. 23A and 23B) with the conductive fill material 102 (see FIGS. 24A and 24B) to form the contact feature 104 (see FIGS. 25A and 25B). Various embodiments discussed herein allow for improving contact feature filling, reducing a resistance of the conductive features, improving reliability of the contact features, and improving device yield.

In accordance with an embodiment, a method includes forming a dielectric layer over a source/drain region. An opening is formed in the dielectric layer. The opening exposes a portion of the source/drain region. A conductive liner is formed on sidewalls and a bottom of the opening. A surface modification process is performed on an exposed surface of the conductive liner. The surface modification process forms a surface coating layer over the conductive liner. The surface coating layer is removed to expose the conductive liner. The conductive liner is removed from the sidewalls of the opening. The opening is filled with a conductive material in a bottom-up manner. The conductive material is in physical contact with a remaining portion of the conductive liner and the dielectric layer. In an embodiment, the surface modification process includes transforming an upper layer of the conductive liner into the surface coating layer. In an embodiment, the surface modification process includes depositing a material of the surface coating layer over the conductive liner. In an embodiment, the surface coating layer includes a metallic material or a metal nitride material. In an embodiment, the conductive liner includes a metallic material and the surface coating layer comprises a nitride of the metallic material. In an embodiment, the conductive liner includes tungsten or cobalt. In an embodiment, the surface coating layer includes titanium-containing tungsten, tantalum-containing tungsten, silicon-containing tungsten, titanium-containing cobalt, tantalum-containing cobalt, or silicon-containing cobalt.

In accordance with another embodiment, a method includes depositing a dielectric layer over an epitaxial source/drain region. The dielectric layer is etched to form an opening therein. The opening exposes the epitaxial source/drain region. A silicide layer is deposited on sidewalls and a bottom of the opening. A conductive liner is non-conformally deposited over the silicide layer in the opening. A surface modification process is performed on an exposed surface of the conductive liner. The surface modification process forms a surface coating layer over the conductive liner. The surface coating layer is removed to expose the conductive liner. The conductive liner and the silicide layer are removed from the sidewalls of the opening to expose the dielectric layer. A conductive material is deposited in the opening. The conductive material is in physical contact with a remaining portion of the silicide layer, a remaining portion of the conductive liner, and the dielectric layer. In an embodiment, the surface modification process includes a plasma process, a thermal soaking process, or a deposition process. In an embodiment, the plasma process is performed on the conductive liner using a plasma generated from a process gas including a nitrogen-containing chemical, a titanium-containing chemical, a tantalum-containing chemical, a cobalt-containing chemical, or an aluminum-containing chemical. In an embodiment, the thermal soaking process is performed on the conductive liner using a process gas including a titanium-containing chemical, a tantalum-containing chemical, or a silicon-containing chemical. In an embodiment, the deposition process deposits a metallic material or a metal nitride material on the conductive liner.

In an embodiment, the conductive material is deposited in the opening in a bottom-up manner. In an embodiment, a portion of the conductive material extends below a top portion of epitaxial source/drain region.

In accordance with yet another embodiment, a method includes forming a dielectric layer over an epitaxial source/drain region. An opening is formed in the dielectric layer. The opening exposes a portion of the epitaxial source/drain region. A silicide layer is formed on sidewalls and a bottom of the opening. A conductive liner is formed over the silicide layer in the opening. A surface modification process is performed on an exposed surface of the conductive liner. The surface modification process forms a surface coating layer over the conductive liner. The opening is filled with a bottom anti-reflective coating (BARC) layer. The BARC layer is recessed below a top surface of the dielectric layer to expose a upper portion of the surface coating layer. A remaining portion of the BARC layer covers a lower portion of the surface coating layer. The upper portion of the surface coating layer and first portions of the conductive liner and the silicide layer not covered by the BARC layer are removed. The remaining portion of the BARC layer is removed to expose the lower portion of the surface coating layer. The lower portion of the surface coating layer is removed. Second portions of the conductive liner and the silicide layer disposed on the sidewalls of the opening are removed to expose the dielectric layer. The opening is filled with a conductive material. The conductive material is in physical contact with a remaining portion of the silicide layer, a remaining portion of the conductive liner, and the dielectric layer. In an embodiment, performing the surface modification process includes performing a plasma process on the conductive liner using a plasma generated from a process gas including a nitrogen-containing chemical, a titanium-containing chemical, a tantalum-containing chemical, a cobalt-containing chemical, or an aluminum-containing chemical. In an embodiment, performing the surface modification process includes performing a thermal soaking process on the conductive liner using a process gas including a titanium-containing chemical, a tantalum-containing chemical, or a silicon-containing chemical. In an embodiment, performing the surface modification process includes depositing a metallic material or a metal nitride material on the conductive liner. In an embodiment, a thickness of the conductive liner on the bottom of the opening is greater than a thickness of the conductive liner on the sidewalls of the opening. In an embodiment, the opening is filled with the conductive material in a bottom-up manner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
forming a dielectric layer over a source/drain region;
forming an opening in the dielectric layer, the opening exposing a portion of the source/drain region;

forming a conductive liner on sidewalls and a bottom of the opening;

performing a surface modification process on an exposed surface of the conductive liner, the surface modification process forming a surface coating layer over the conductive liner;

removing the surface coating layer to expose the conductive liner;

removing the conductive liner from the sidewalls of the opening; and filling the opening with a conductive material in a bottom-up manner, the conductive material being in physical contact with a remaining portion of the conductive liner and the dielectric layer.

2. The method of claim 1, wherein the surface modification process comprises transforming an upper layer of the conductive liner into the surface coating layer.

3. The method of claim 1, wherein the surface modification process comprises depositing a material of the surface coating layer over the conductive liner.

4. The method of claim 1, wherein the surface coating layer comprises a metallic material or a metal nitride material.

5. The method of claim 1, wherein the conductive liner comprises a metallic material and the surface coating layer comprises a nitride of the metallic material.

6. The method of claim 1, wherein the conductive liner comprises tungsten or cobalt.

7. The method of claim 1, wherein the surface coating layer comprises titanium-containing tungsten, tantalum-containing tungsten, silicon-containing tungsten, titanium-containing cobalt, tantalum-containing cobalt, or silicon-containing cobalt.

8. A method comprising:
depositing a dielectric layer over an epitaxial source/drain region;

etching the dielectric layer to form an opening therein, the opening exposing the epitaxial source/drain region;

depositing a silicide layer on sidewalls and a bottom of the opening;

non-conformally depositing a conductive liner over the silicide layer in the opening;

performing a surface modification process on an exposed surface of the conductive liner, the surface modification process forming a surface coating layer over the conductive liner;

removing the surface coating layer to expose the conductive liner;

removing the conductive liner and the silicide layer from the sidewalls of the opening to expose the dielectric layer; and depositing a conductive material in the opening, the conductive material being in physical contact with a remaining portion of the silicide layer, a remaining portion of the conductive liner, and the dielectric layer.

9. The method of claim 8, wherein the surface modification process comprises a plasma process, a thermal soaking process, or a deposition process.

10. The method of claim 9, wherein the plasma process is performed on the conductive liner using a plasma generated from a process gas comprising a nitrogen-containing chemical, a titanium-containing chemical, a tantalum-containing chemical, a cobalt-containing chemical, or an aluminum-containing chemical.

11. The method of claim 9, wherein the thermal soaking process is performed on the conductive liner using a process gas comprising a titanium-containing chemical, a tantalum-containing chemical, or a silicon-containing chemical.

12. The method of claim 9, wherein the deposition process deposits a metallic material or a metal nitride material on the conductive liner.

13. The method of claim 8, wherein the conductive material is deposited in the opening in a bottom-up manner.

14. The method of claim 8, wherein a portion of the conductive material extends below a top portion of the epitaxial source/drain region.

15. A method comprising:
forming a dielectric layer over an epitaxial source/drain region;

forming an opening in the dielectric layer, the opening exposing a portion of the epitaxial source/drain region;

forming a silicide layer on sidewalls and a bottom of the opening;

forming a conductive liner over the silicide layer in the opening;

performing a surface modification process on an exposed surface of the conductive liner, the surface modification process forming a surface coating layer over the conductive liner;

filling the opening with a bottom anti-reflective coating (BARC) layer;

recessing the BARC layer below a top surface of the dielectric layer to expose an upper portion of the surface coating layer, a remaining portion of the BARC layer covering a lower portion of the surface coating layer;

removing the upper portion of the surface coating layer and first portions of the conductive liner and the silicide layer not covered by the BARC layer;

removing the remaining portion of the BARC layer to expose the lower portion of the surface coating layer;

removing the lower portion of the surface coating layer;

removing second portions of the conductive liner and the silicide layer disposed on the sidewalls of the opening to expose the dielectric layer; and filling the opening with a conductive material, the conductive material being in physical contact with a remaining portion of the silicide layer, a remaining portion of the conductive liner, and the dielectric layer.

16. The method of claim 15, wherein performing the surface modification process comprises performing a plasma process on the conductive liner using a plasma generated from a process gas comprising a nitrogen-containing chemical, a titanium-containing chemical, a tantalum-containing chemical, a cobalt-containing chemical, or an aluminum-containing chemical.

17. The method of claim 15, wherein performing the surface modification process comprises performing a thermal soaking process on the conductive liner using a process gas comprising a titanium-containing chemical, a tantalum-containing chemical, or a silicon-containing chemical.

18. The method of claim 15, wherein performing the surface modification process comprises depositing a metallic material or a metal nitride material on the conductive liner.

19. The method of claim 15, wherein a thickness of the conductive liner on the bottom of the opening is greater than a thickness of the conductive liner on the sidewalls of the opening.

20. The method of claim 15, wherein the opening is filled with the conductive material in a bottom-up manner.

* * * * *